(12) United States Patent
Dzurak et al.

(10) Patent No.: US 7,911,265 B2
(45) Date of Patent: Mar. 22, 2011

(54) INTERFACING AT LOW TEMPERATURE USING CMOS TECHNOLOGY

(75) Inventors: Andrew Steven Dzurak, Darlinghurst (AU); Sobhath Ramesh Ekanayake, Glenwood (AU); Robert Graham Clark, Balgowlah Heights (AU); Torsten Lehmann, Earlwood (AU)

(73) Assignee: Qucor Pty. Ltd. (AU)

( * ) Notice: Subject to any disclaimer, the term of this patent is extended or adjusted under 35 U.S.C. 154(b) by 444 days.

(21) Appl. No.: 12/012,578

(22) Filed: Feb. 4, 2008

(65) Prior Publication Data
US 2008/0297230 A1    Dec. 4, 2008

(51) Int. Cl.
*H01L 25/00* (2006.01)
(52) U.S. Cl. .................. 327/566; 327/527; 327/567
(58) Field of Classification Search .............. 327/527, 327/565, 566, 567
See application file for complete search history.

(56) References Cited

U.S. PATENT DOCUMENTS

| | | | | |
|---|---|---|---|---|
| 5,861,336 A | * | 1/1999 | Reedy et al. | 438/407 |
| 6,599,781 B1 | * | 7/2003 | Li | 438/142 |

* cited by examiner

*Primary Examiner* — Jeffrey S Zweizig
(74) *Attorney, Agent, or Firm* — Wood, Phillips, Katz, Clark & Mortimer

(57) ABSTRACT

This invention concerns interfacing to electronic circuits or systems operating at low temperature or ultra-low temperature using complementary metal-oxide semiconductor (CMOS) technology. Low temperature in this case refers to cryogenic temperatures in particular, but not exclusively, to the 4.2 K region. Ultra-low temperatures here refers to the sub-1 K range, usually accessed using dilution refrigerator systems. The electronic circuits comprise a controller (for writing and manipulation), an observer (for readout and measurement) circuits, or both, fabricated from ultra-thin silicon-on-insulator (SOI) CMOS technology.

15 Claims, 28 Drawing Sheets

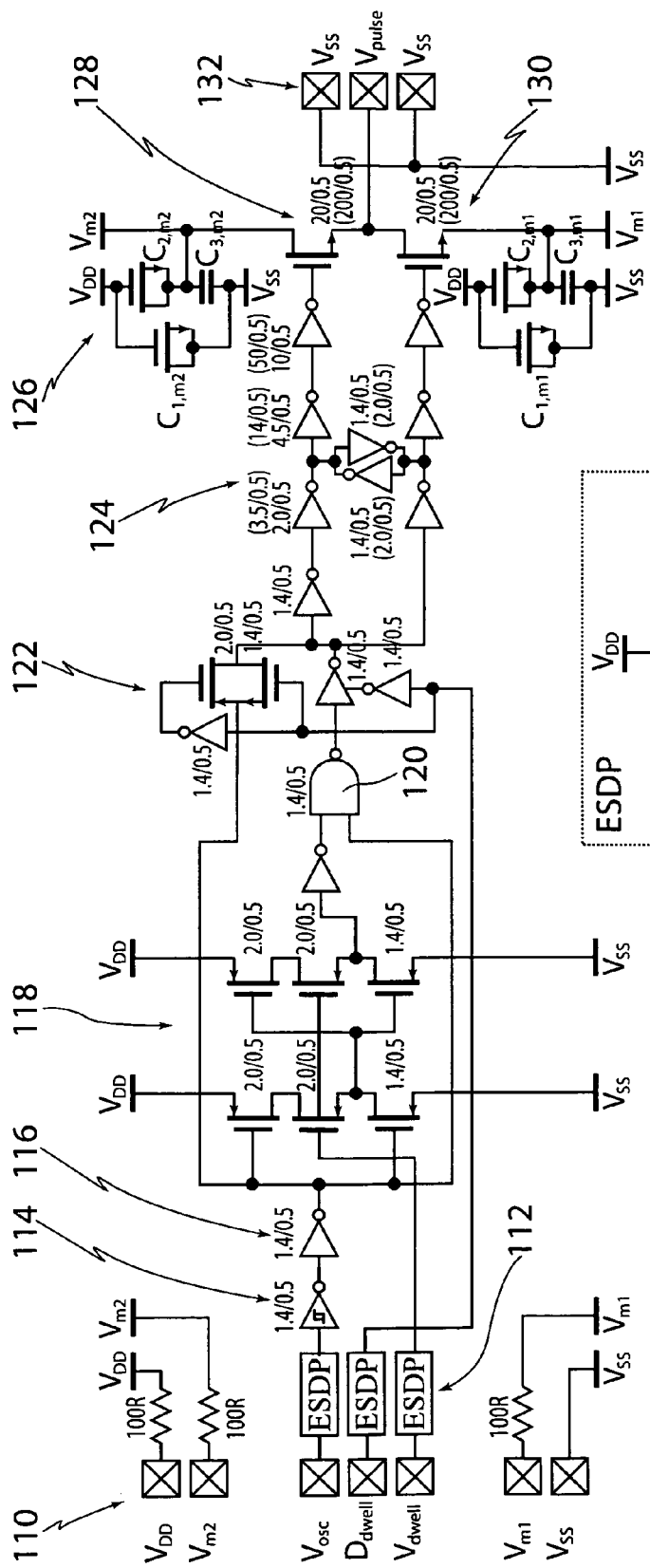
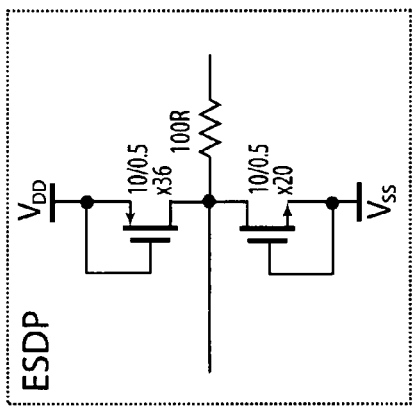
Figure 13a
Figure 13b

INTERFACING AT LOW TEMPERATURE USING CMOS TECHNOLOGY

TECHNICAL FIELD

This invention concerns interfacing to electronic circuits or systems, such as integrated circuits, operating at low temperature using complementary metal-oxide semiconductor (CMOS) technology. Low temperature in this case refers to cryogenic temperatures, in particular but not exclusively to the 4.2 K region. Ultra-low temperatures here refers to the sub 1 K range, usually accessed using dilution refrigerator systems.

BACKGROUND ART

Electronic components in general, such as bipolar transistors will not work at low temperatures, below about 70 K.

Complementary metal-oxide semiconductor, technology (CMOS) was originally developed for room-temperature low-power applications.

Although much domestic and commercial electronics operate at room temperature (300 K) there are an important and growing number of applications which require lower temperatures.

It has been known for some decades that metal-oxide-semiconductor field-effect transistors (MOSFETs) can operate at low-temperatures. For example, the integer quantum Hall effect was discovered by von Klitzing [4] in 1980, from the effects of an external magnetic field on the two-dimensional electron system (2DES) of a MOSFET at 4.2 K.

Additionally, there has been some reported work in characterizing silicon MOSFETs at temperatures $\leq$4.2 K, such as the demonstration of an operational amplifier fabricated by a commercial process which is was able to operate at 4.2 K [5]. Also there has been work done on modeling the behavior of MOSFETs in the sub-100 mK [6] and 4.2 K [7] temperature regions. There have been demonstrations of the operation of MOSFETs integrated with single-electron transistors (SETs) [8], [9] at 4.2 K, and other demonstrations of the effects of CMOS processing steps, namely using lightly-doped drains (LDDs) and $V_t$-adjust implantation, on the drain current kink effect of NMOS FETs at 4.2 K [10]. Others have integrated commercial CMOS processes with superconducting technologies [11-13], which has led them to characterize those MOSFETs at 4.2 K. However, it is quite commonly documented that MOSFET channels may freeze-out at cryogenic temperatures [11], [12] rendering them unsuitable for use for control of quantum circuits. Additionally, it is not usually practical to produce CMOS circuits of even modest complexity in a research laboratory; but only in a commercial foundry.

DISCLOSURE OF THE INVENTION

The invention is an electronic circuit or system (including an integrated circuit) operating at low temperatures and ultra-low temperatures, and comprising controller (for writing and manipulation) or observer (for readout and measurement) circuits, or both, fabricated from ultra-thin silicon-on-insulator (SOI) CMOS technology.

The controller and observer circuits may be fabricated, in particular, using SOI-CMOS field-effect transistor (FET) technology.

The controller and observer circuits may employ CMOS circuits. As a result the invention is able to exploit the following properties of SOI-CMOSFET technology:

The inherent unity-gain frequency ($f_t$) which is due to the short channel length and lower parasitics of SOI devices, and which can be employed to generate rapid pulse edge transition times ($t_r \sim f_t^{-1}$) and also high bandwidth (in the range 10-100 GHz, or above) for amplification.

The high pulse-voltage swing ($\pm 500$ mV) is available in MOS technology. Ultra-low power operation is due to the low parasitics of SOI devices. In addition there is high capacitive drivability and scalability available in this technology. These features provide important advantages, particularly for qubit control, relative to other competing technologies such as RSFQ [3] which can only produce pulse-voltage swings of ~10 mV.

Further advantages are large scale integration, and wide commercial availability. In fact, it has been found that the invention can be designed and built using a suitable SOI-CMOS process that was developed particularly for radio-frequency (RF) applications developed at a commercial foundry.

In a practical embodiment many SOI-CMOS circuits, that is tens, hundreds or even thousands, may be fabricated on a single integrated circuit using the foundry process.

The SOI-CMOS circuits of the invention may be fabricated on the same integrated circuit as other circuit elements, including the circuits or systems being controlled or observed. The invention may therefore comprise a single integrated circuit having both the control and readout circuit elements, as well as the circuit elements being controlled or observed.

Alternatively, the SOI-CMOS circuits of the invention may be on a separate integrated circuit, and possibly in a different temperature environment, from the circuit or system being controlled or observed.

The SOI-CMOS circuits of the invention, because of their high unity-gain frequency ($f_t$), may be used to generate voltage or current pulses with rapid pulse-edge transition times, or generalized voltage or current waveforms with high temporal control. Such high-bandwidth waveform generators may be used to control other circuits or systems that require low temperatures for their operation. Because the SOI-CMOS circuits of the invention can operate at low temperatures, it is possible for them to be conveniently interfaced with the circuits or systems being controlled, with minimal corruption or distortion of the controlling voltage or current waveform.

The SOI-CMOS circuits of the invention, because of their high unity-gain frequency ($f_t$), may be also used as high-bandwidth, voltage or current amplifiers. Such high-bandwidth amplifiers may be used to observe (i.e. measure) other circuits or systems that require low or ultra-low temperatures for their operation. Because the SOI-CMOS circuits of the invention can operate at low temperatures, it is possible for them to be conveniently interfaced with the circuits or systems being observed (measured), with a high signal-to-noise ratio and without losing high-frequency information.

An example where the controller and observer circuits of the invention would be particularly useful is to provide a stable steady-state voltage or current waveform suitable to control quantum bits, for instance to place and maintain a quantum bit (qubit) in a quantum-coherent superposition of $|0\rangle$ and $|1\rangle$ states. This is because most qubits require low temperatures for their operation.

In addition the controller circuits of the invention are able to provide duty-cycle (dwell time) controlled rapid single-shot pulses suitable for qubit control.

As a result the other electronic circuits or systems, those being controlled and observed, may include quantum processors, and the controller and observer circuits may be used for initialization, control (writing and manipulation) and observation (readout and measurement) of quantum bits (qubits) in a quantum computer.

Further, the controller and observer circuit components of the invention have been found to operate at ultra-low temperatures, that is, in the sub-100 mK range.

As a result the other electronic circuits or systems, those being controlled and observed, may include silicon-based quantum bits, for instance those involving spin or charge qubits, and the controller and observer circuits may be used at low temperatures or ultra-low temperatures for initialization, control (writing and manipulation) and observation (readout and measurement) of quantum bits (qubits) in a quantum computer. The controller and observer circuitry may be fabricated on the same integrated circuit as the quantum processor. Alternatively, the controller and observer circuits may be fabricated on a separate integrated circuit from the quantum processor, and may be operated in the same, or at a different, temperature from the quantum processor, with appropriate low-temperature interfacing between the two.

BRIEF DESCRIPTION OF THE DRAWINGS

An example of the invention will be described with reference to the accompanying drawings, in which:

FIG. 7 is a series of graphs as follows.

FIG. 9 is a series of graphs as follows: FIG. 9(a) the step response characteristics of PSC 10/0.4 PMOS device at 300 K from 500 nm process; FIG. 9(b) the step response characteristics of PSC 10/0.4 PMOS device at 4.2 K from 500 nm process.

FIGS. 13a and b are schematic diagrams for the first generation fast voltage-pulse generator for which FIG. 11 is the layout;

BEST MODES OF THE INVENTION

Part 1

This example concerns the control and readout for a silicon (Si) based quantum computer. A quantum binary digit (qubit) is the fundamental computational element of the quantum computer. The solid-state qubit can be either a spin qubit [1], or a charge qubit [2]. In this example we consider a silicon charge qubit, however, we note that silicon spin-based qubits are expected to have much longer quantum coherence times and would be the preferred choice in most cases.

Figure 1:
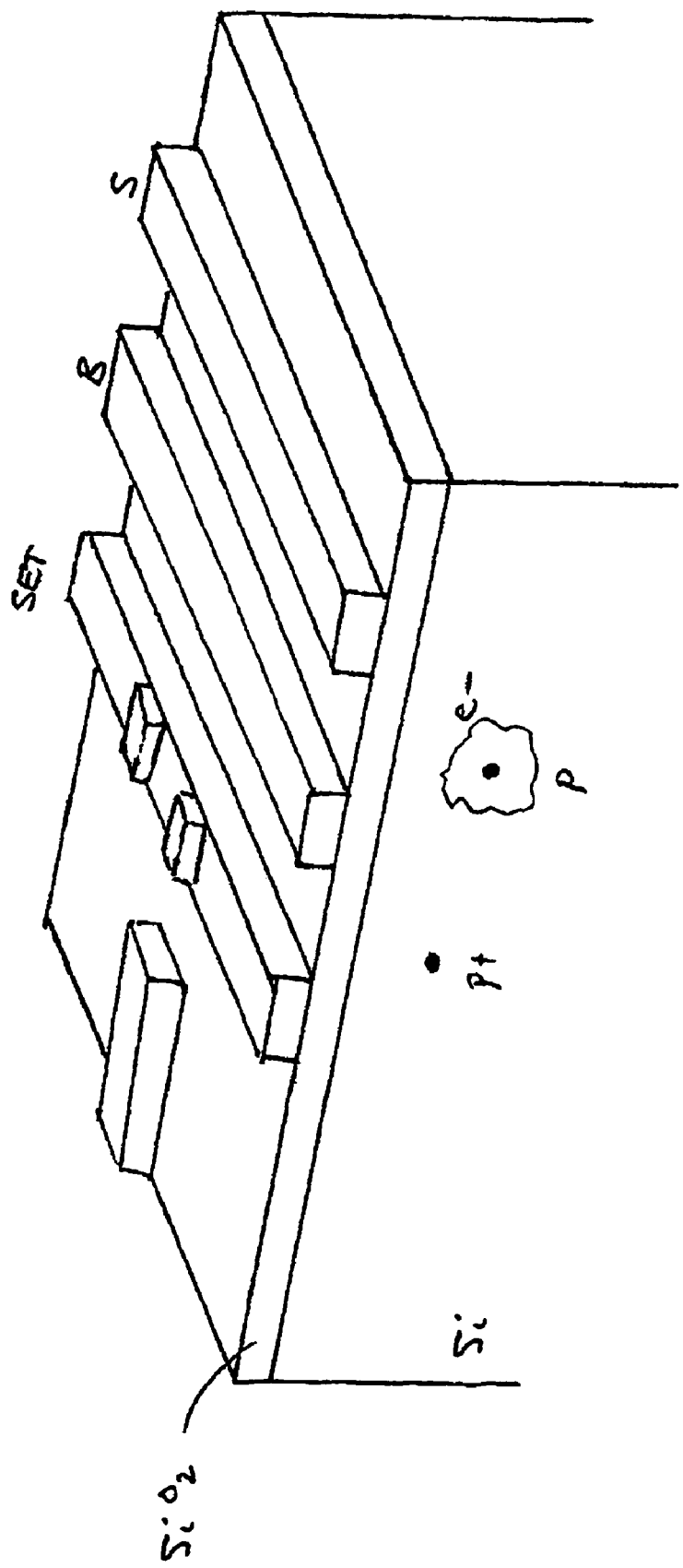
FIG. 1 is a diagram of a solid-state charge qubit based on buried dopants in silicon.

A buried donor charge qubit is shown in FIG. 1 for the case of P dopants in Si, although a number of other dopant-substrate systems could also be considered. The lowest two states of a single electron localized by the double well formed by two donor $P^+$ ions give rise to a natural identification of the quantum logic states. External control over the barrier height and potential offset (or symmetry) is facilitated by B and S gates, respectively, placed about the buried ($P-P^+$) system. With appropriate negative bias we can identify localized qubit states with high precision: $|0\rangle=|L\rangle$ and $|1\rangle=|R\rangle$. Finally, a SET facilitates initialization and readout of the qubit.

Figure 2:
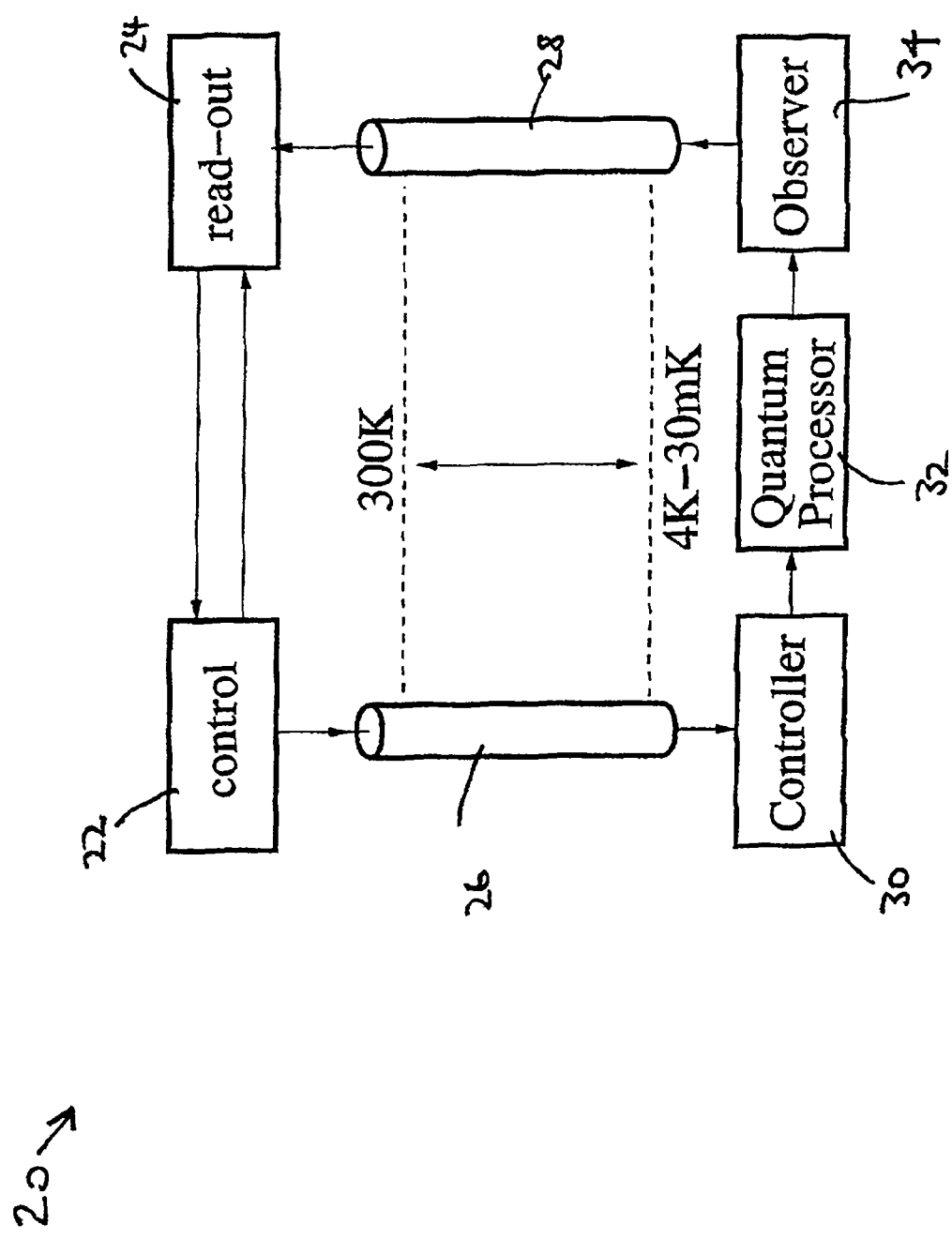
FIG. 2 is a schematic diagram of a general quantum computer including the controller and readout interfaces.

The charge qubit requires the integration of a controller and observer circuit for input-process-output operations: the former to write and manipulate the initial states of the qubits, and the latter to read their final states. FIG. 2 illustrates a schematic generalized quantum computing system 20.

System 20 involves conventional room temperature (300 K) control 22 and read-out 24 systems. These room temperature systems are connected to systems at low (4.2 K) or ultra-low temperatures (sub-100 mK) in conventional fashion using insulated pipelines as indicated at 26 and 28. In the low temperature environment controller circuits 30 are operable to initialize qubits in a quantum processor 32. Observer circuits 34 are able to readout the qubit states after processing.

Both the controller and observer circuits are fabricated from ultra-thin silicon-on-insulator (SOI) using CMOS technology. The circuits provide duty cycle, that is dwell time, controlled rapid single-shot pulses and therefore involve fast pulse generators, or voltage latches, among other circuit elements. For instance, digital state machines, digital to analogue converters, amplifiers, analog-to-digital converters and signal conditioning circuits such as SET interfaces.

Figure 3:
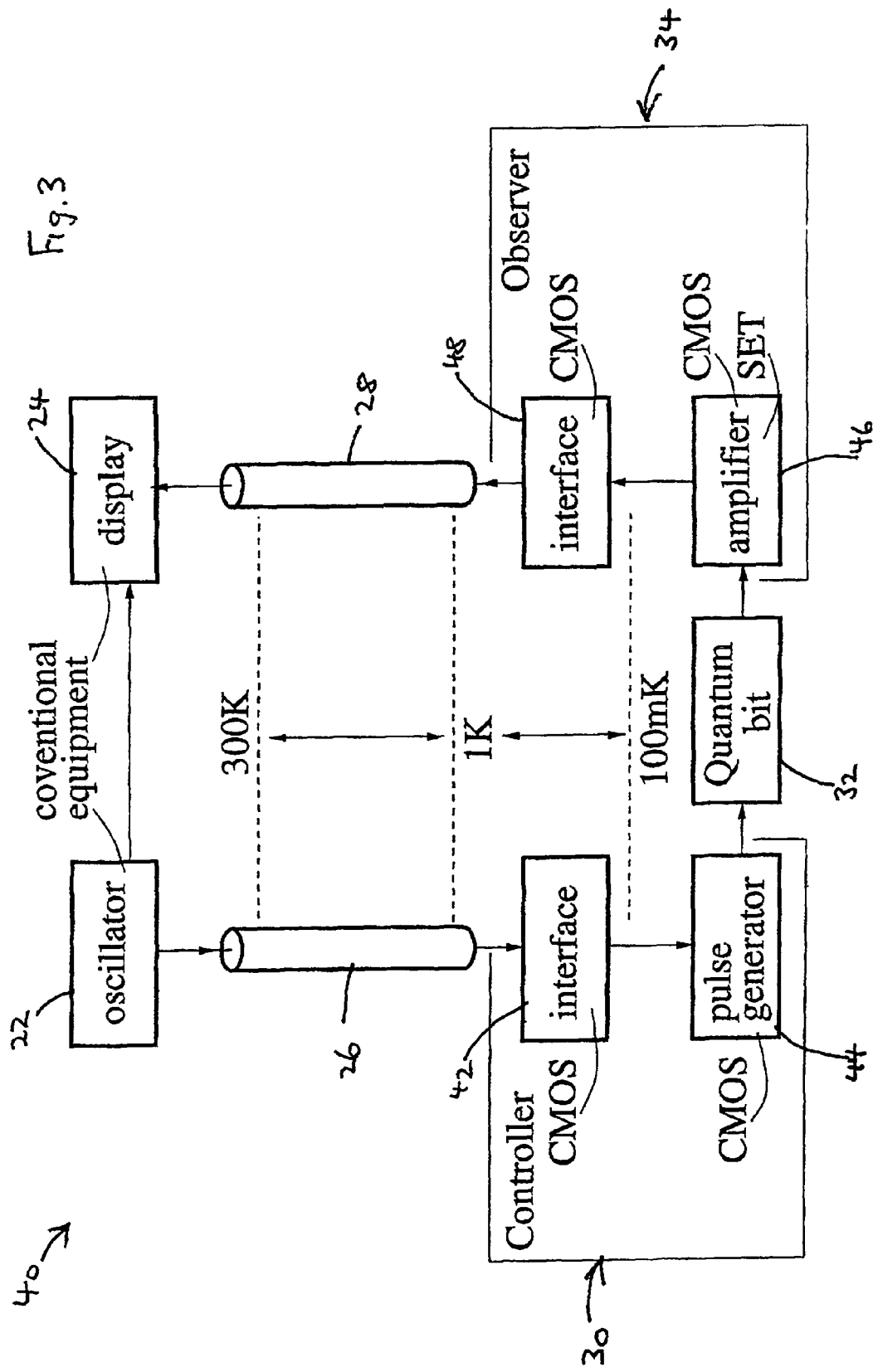
FIG. 3 is a schematic diagram of a more specific system, with controller and readout interfaces to a single quantum bit.

FIG. 3 illustrates a more specific quantum computing system 40 that is used to control and observe (measure) a single qubit. Here the room temperature control system 22 involves an oscillator, and the readout system 24 a display. At 1 K the controller 30 comprises a CMOS interface sub-system 42 connected to a control sub-system comprising a CMOS pulse generator 44. The CMOS pulse generator 44 operates at 100 mK and operates to initialize a quantum bit 32. The observer 34 comprises a SET and CMOS amplifier 46 which operates at 100 mK to readout the quantum state after entanglement. A CMOS interface sub-system 48 operating at 1 K completes the observer system 34.

The integrated controller-qubit-observer (CQO) circuit system (quantum computer) can be implemented either as a modular or monolithic design. The quantum processor containing the qubits must operate at sub-100 mK temperatures, to ensure quantum phase coherence times long enough for feasible qubits. In this example the controller and observer circuits are fabricated of silicon-on-insulator (SOI) complementary metal-oxide-semiconductor (CMOS) field-effect transistor (FET) technology.

A typical control signal to use for qubit control is a duty-cycle (dwell time) controlled rapid single-shot pulse.

INDUSTRIAL APPLICATION

Figure 4:
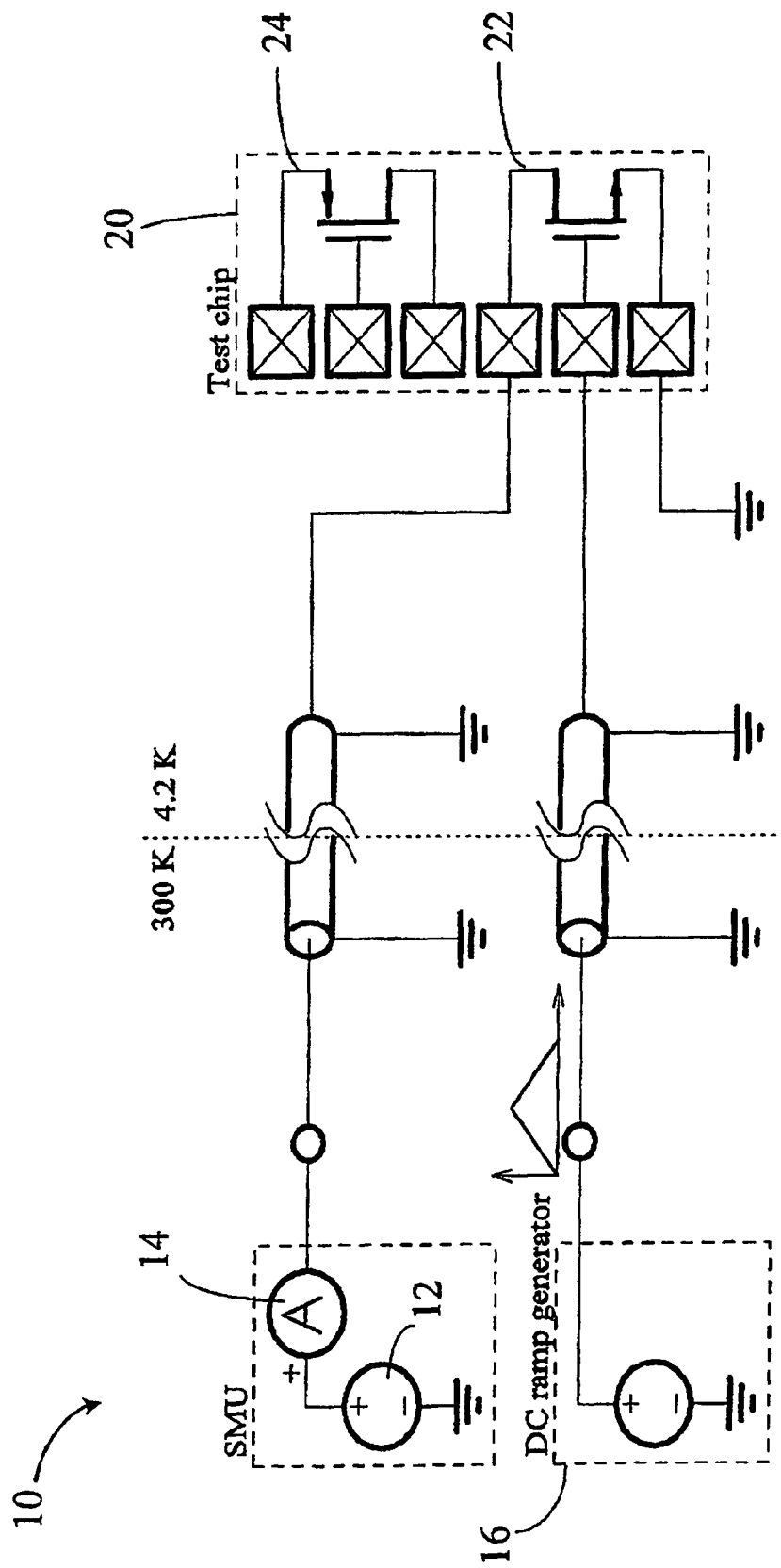
FIG. 4 is a block diagram of the DC I(V) measurement setup for 10/0.4 NMOS (PMOS) and 10/0.25 NMOS (PMOS) readout.

The utility of the invention will be demonstrated with reference to a description of experimental work with reference to the following drawings, in which:

FIG. 4 is a block diagram of the DC I(V) measurement setup for 10/0.4 NMOS (PMOS) and 10/0.25 NMOS (PMOS) readout.

Figure 5:
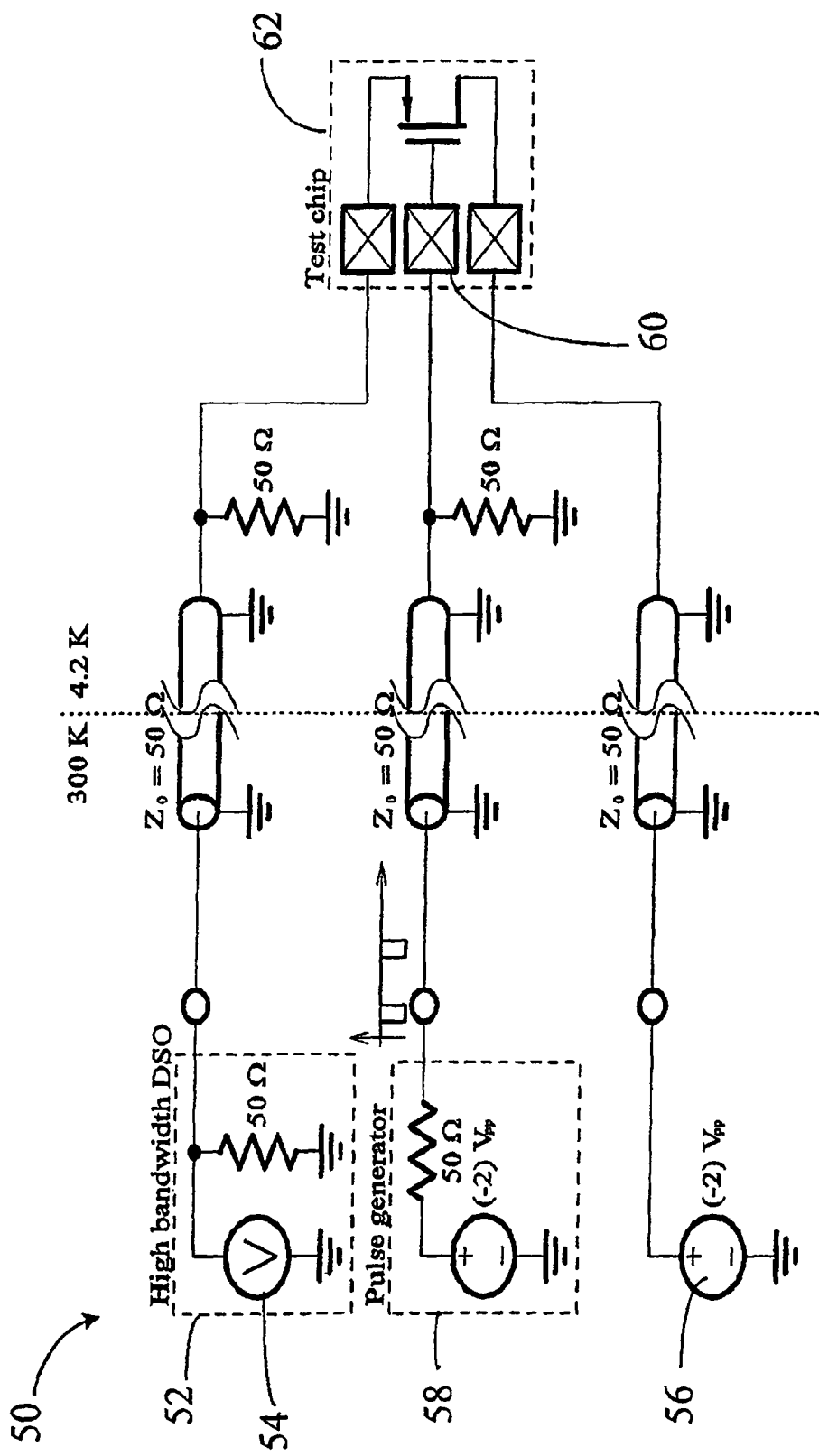
FIG. 5 is a block diagram of a source-follower circuit setup for measuring transient response characteristics of 10/0.4 PMOS devices.

FIG. 5 is a block diagram of a source-follower circuit setup for measuring transient response characteristics of 10/0.4 PMOS devices.

FIG. 6 is a series of graphs of:
(a) the DC response $I_D(V_{GS})$ characteristic of PSC 10/0.4 NMOS and 10/0.4 PMOS devices at room temperature 300 K, from 500 nm process.
(b) the DC response $I_D(V_{DS})$ of PSC 10/0.4 NMOS and 10/0.4 PMOS devices at room temperature 300 K, from 500 nm process.
(c) the DC response $I_D(V_{GS})$ characteristic of PSC 10/0.4 NMOS and 10/0.4 PMOS devices at T=4.2 K, from 500 nm process.
(d) the DC response $I_D(V_{DS})$ characteristic of PSC 10/0.4 NMOS and 10/0.4 PMOS devices at T=4.2 K, from 500 nm process.
(e) the DC response $I_D(V_{GS})$ characteristic of PSC 10/0.4 NMOS and 10/0.4 PMOS devices at T=30 mK, from 500 nm process.
(f) the DC response $I_D(V_{DS})$ characteristic of PSC 10/0.4 NMOS and 10/0.4 PMOS devices at T=30 mK, from 500 nm process.

FIG. 7 is a series of graphs of:
(a) the DC response $I_D(V_{GS})$ characteristics of PSC 10/0.25 NMOS and 10/0.25 PMOS devices at 300 K, from 250 nm process.
(b) the DC response $I_D(V_{DS})$ characteristics of PSC 10/0.25 NMOS and 10/0.25 PMOS devices at 300 K, from 250 nm process.
(c) the DC response $I_D(V_{GS})$ characteristics of PSC 10/0.25 NMOS and 10/0.25 PMOS devices at 4.2 K, from 250 nm process.
(d) the DC response $I_D(V_{DS})$ characteristics of PSC 10/0.25 NMOS and 10/0.25 PMOS devices at 4.2 K, from 250 nm process.
(e) the DC response $I_D(V_{GS})$ characteristics of PSC 10/0.25 NMOS and 10/0.25 PMOS devices at 30 mK, from 250 nm process.
(f) the DC response $I_D(V_{DS})$ characteristics of PSC 10/0.25 NMOS and 10/0.25 PMOS devices at 30 mK, from 250 nm process.

Figure 8:
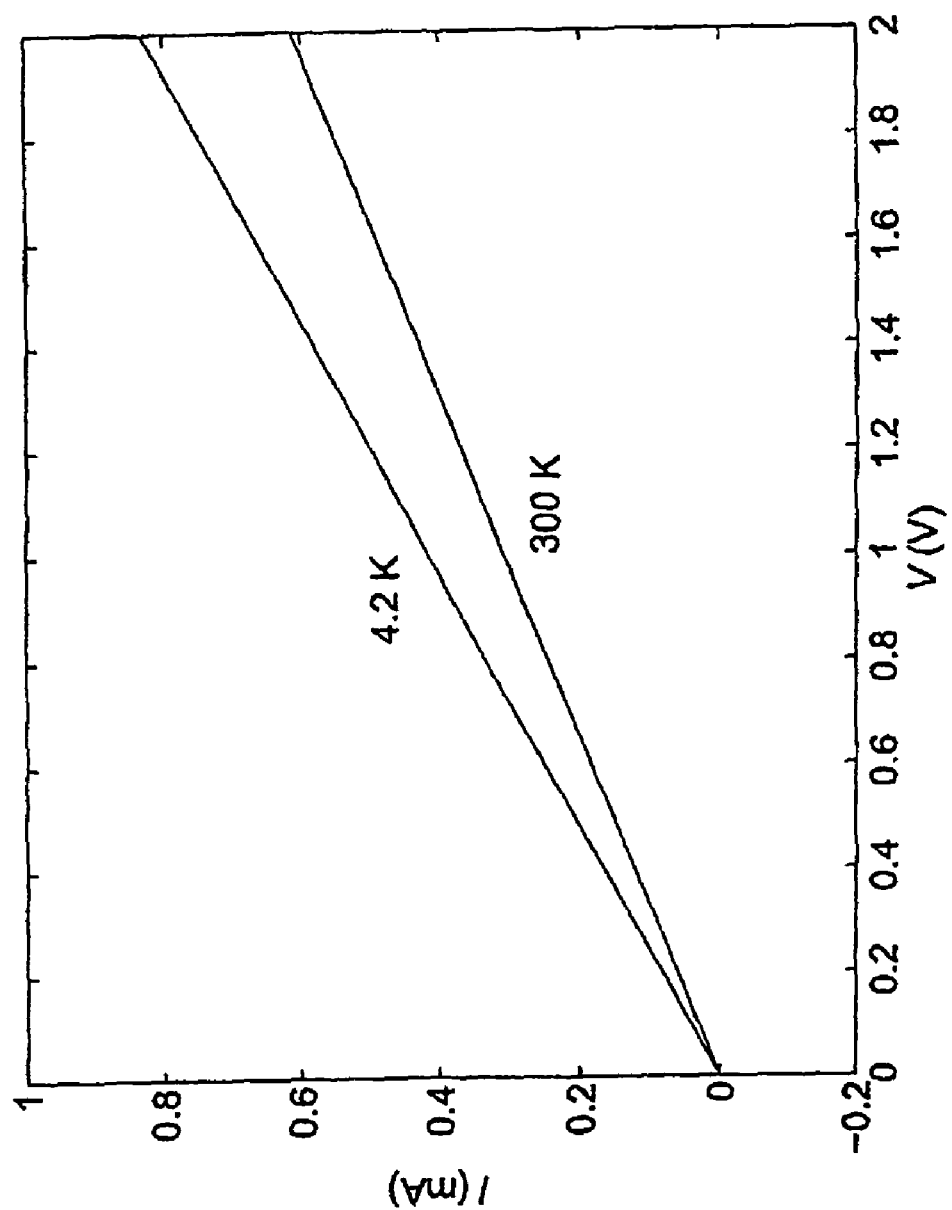
FIG. 8 is a graph of the DC response of 50/10 n.sup.+- diffusion resistor from 500 nm process.
Figure 7A:
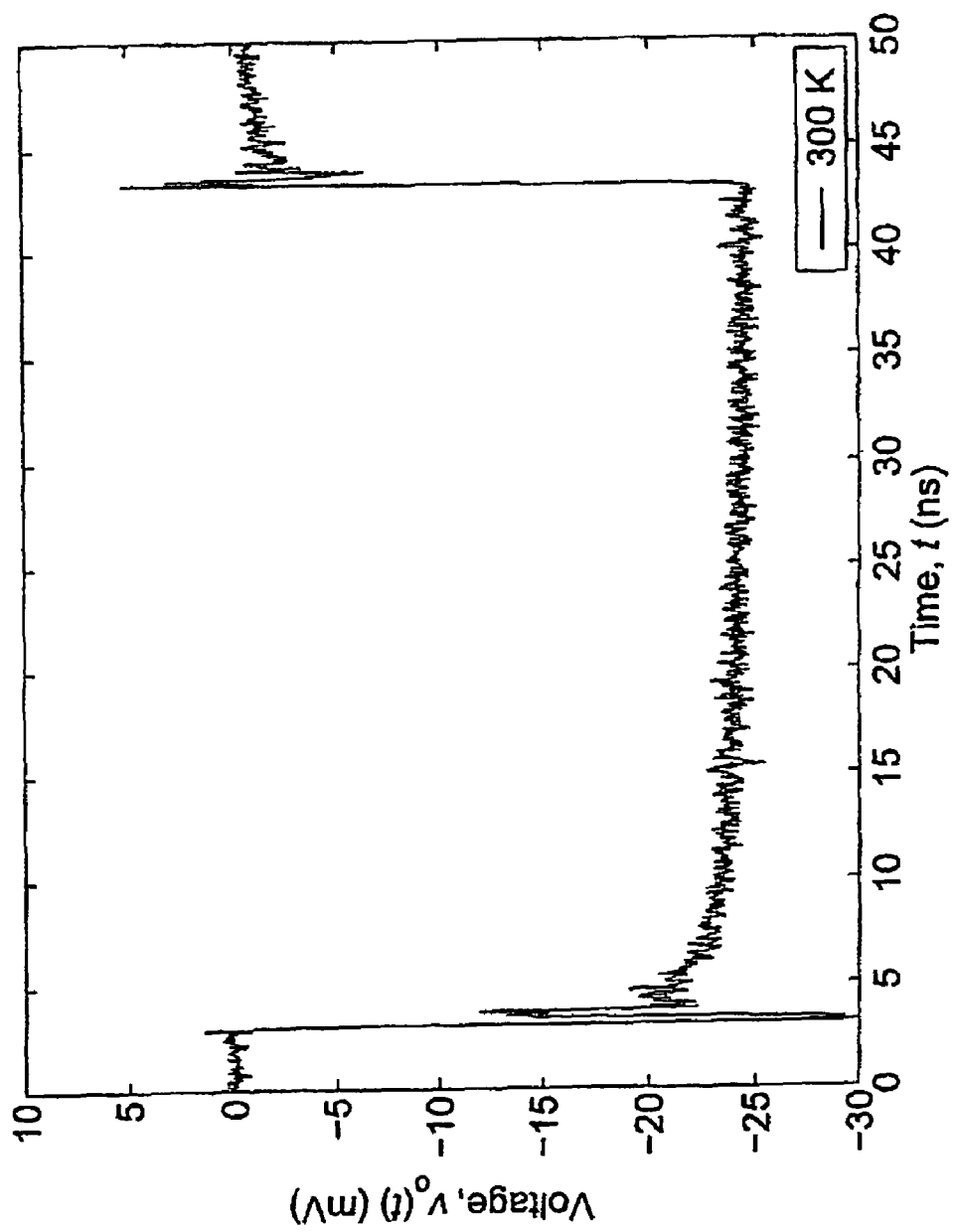
Figure 7B:
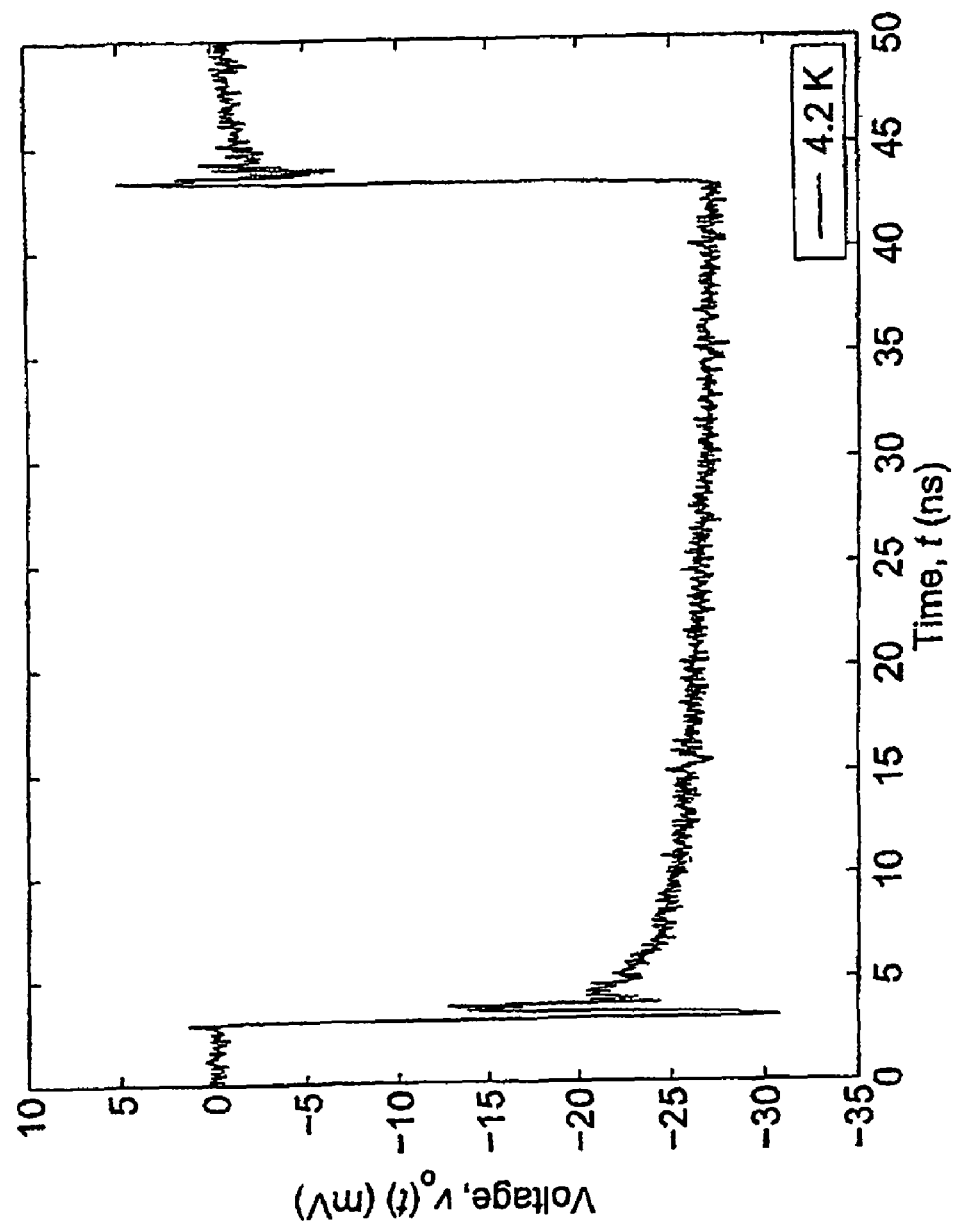

FIG. 8 is a graph of the DC response of 50/10 $n^+$-diffusion resistor from 500 nm process.

Figure 9C:
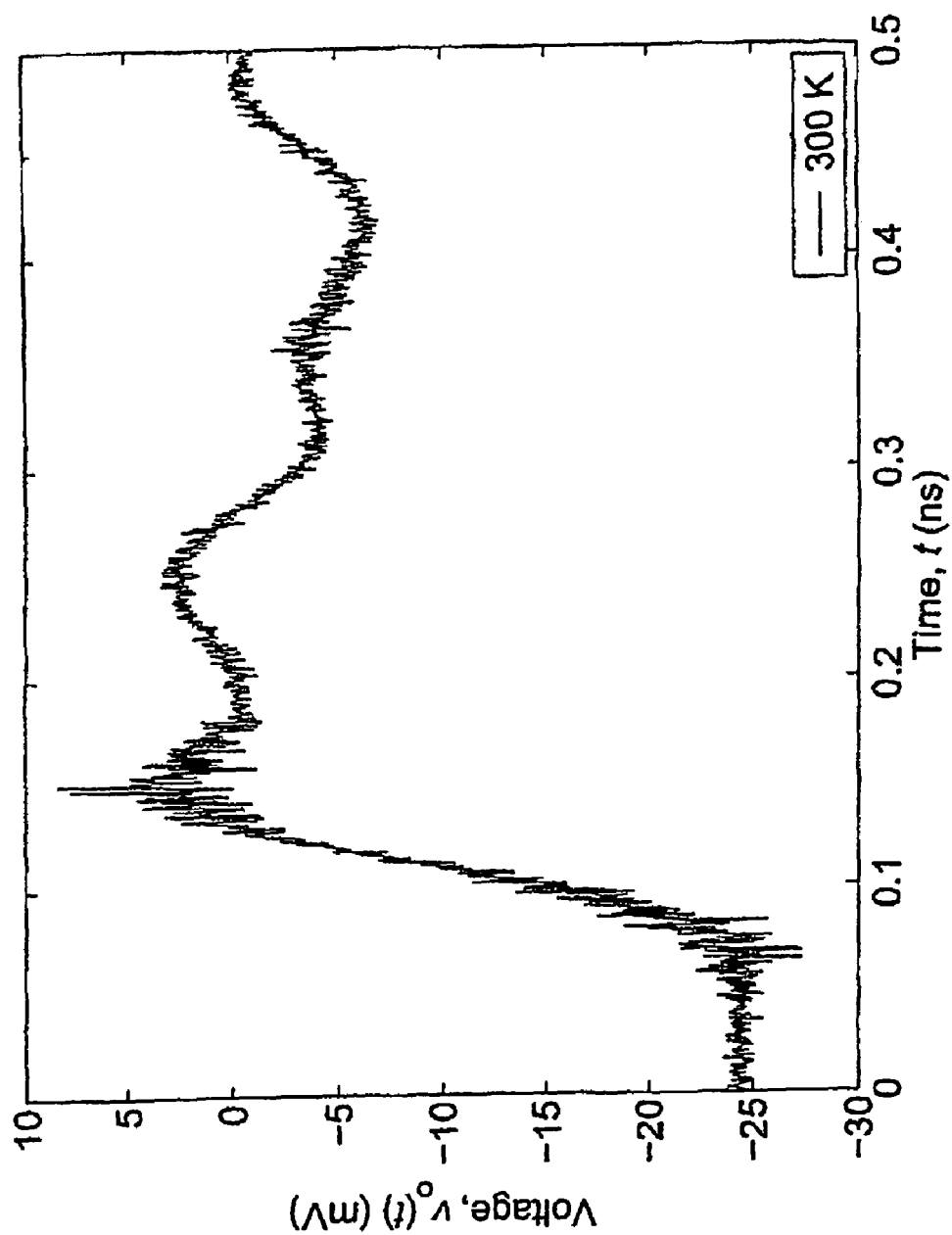
FIG. 9(c) the step response characteristics (a) with a different time scale.
Figure 9D:
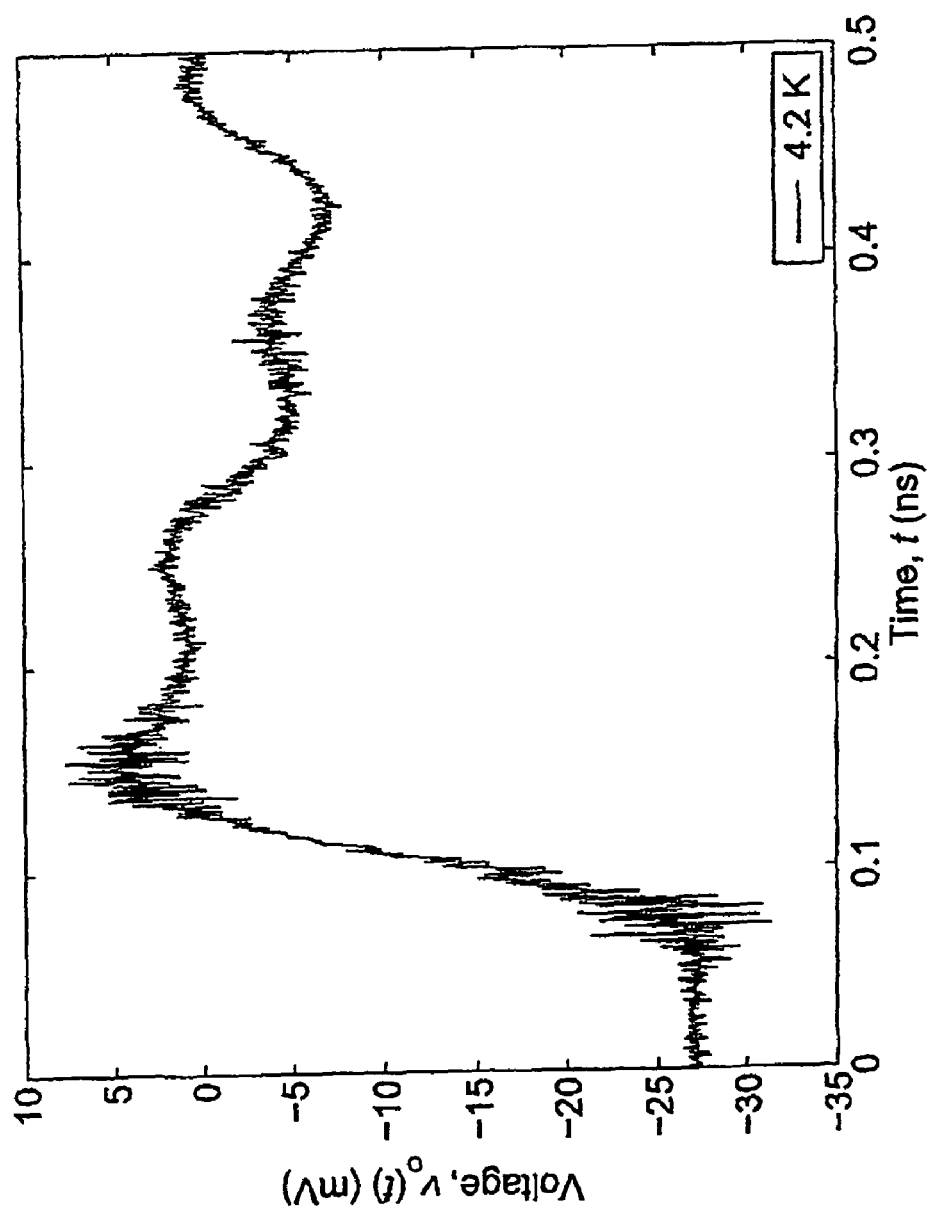
FIG. 9(d) the step response characteristics (b) with a different time scale.

FIG. 9 is a series of graphs of:
(a) the step response characteristics of PSC 10/0.4 PMOS device at 300 K from 500 nm process.
(b) the step response characteristics of PSC 10/0.4 PMOS device at 4.2 K from 500 nm process.
(c) the step response characteristics (a) with a different time scale.
(d) the step response characteristics (b) with a different time scale.

The proof that an integrated controller-qubit-observer (CQO) circuit system (quantum processor) can be built is achieved by characterizing SOI MOSFETs in the sub-100 mK temperature region where the integrated CQO circuit will be operating during qubit control and readout. Before going further Table 1 defines the variables that will be used.

TABLE 1

Definition of variables.

| Variable | Definition | Dimension |
| --- | --- | --- |
| W | Channel width | μm |
| L | Channel length | μm |
| $V_{GS}$ | Gate-source voltage | V |
| $V_{DS}$ | Drain-source voltage | V |
| $I_D$ | Drain current | mA |
| $f_t$ | Unity-gain frequency | GHz |
| $t_r$ | Rise time | ps |
| Vt | Threshold voltage | V |

The cryogenic operability of selected commercially available SOI thin-Si CMOS technologies, will now be described. In particular, the experimental characterization of SOI NMOS and PMOS FETs from the Peregrine Semiconductor Corporation (PSC) ultra-thin silicon (UTSi) silicon-on-sapphire (SOS) processes; the processes and devices that have been investigated are shown in Table 2.

TABLE 2

Processes and devices investigated.

| Process | W/L | Device |
| --- | --- | --- |
| 500 nm | 10/0.4 | NMOS FET |
|  | 10/0.4 | PMOS FET |
|  | 50/10 | $n^+$-diffusion resistor |
| 250 nm | 10/0.25 | NMOS FET |
|  | 10/0.25 | PMOS FET |

The results show that SOI CMOS can be used for the specific purpose of qubit controller and observer circuit design for a quantum processor. The results also show that SOI CMOS can be used for other ultra-low temperature and ultra-low power applications as well.

DC Response Measurement

The experimental setup used to obtain the direct current (DC) response characterization of NMOS and PMOS devices at room temperature (300 K), liquid helium temperature (4.2 K), and sub-100 mK temperature (30 mK) is shown in FIG. 4.

The experimental setup 10 involves a power supply 12 and ammeter 14 to read measurements, as well as a DC ramp generator 16 to provide input voltage to the gate, all located at room temperature 300 K. The test chip 20 contains NMOS 22 and PMOS 24 devices which are able to be directly coupled to the power source 16 and measurement probes 14. The supply polarity is selected accordingly, and in FIG. 4 the supply is shown connected to the NMOS device.

During the NMOS (PMOS) device measurement, the terminals of the PMOS (NMOS) device are pulled-down to ground. This approach enables alternatively measuring the devices in situ in the same temperature cycle for consistency. The DC measurement results of the NMOS and PMOS devices from the 500 nm process are shown in FIG. 6 where:

(a) is the DC response $I_D(V_{GS})$ characteristic of PSC 10/0.4 NMOS and 10/0.4 PMOS devices at room temperature 300 K, from 500 nm process.
(b) is the DC response $I_D(V_{DS})$ characteristic of PSC 10/0.4 NMOS and 10/0.4 PMOS devices at room temperature 300 K, from 500 nm process.
(c) is the DC response $I_D(V_{GS})$ characteristic of PSC 10/0.4 NMOS and 10/0.4 PMOS devices at T=4.2 K, from 500 nm process.
(d) is the DC response $I_D(V_{DS})$ characteristic of PSC 10/0.4 NMOS and 10/0.4 PMOS devices at T=4.2 K, from 500 nm process.
(e) is the DC response $I_D(V_{GS})$ characteristic of PSC 10/0.4 NMOS and 10/0.4 PMOS devices at T=30 mK, from 500 nm process.
(f) is the DC response $I_D(V_{DS})$ characteristic of PSC 10/0.4 NMOS and 10/0.4 PMOS devices at T=30 mK, from 500 nm process.

The DC measurement results of the NMOS and PMOS devices from the 250 nm process are shown in FIG. 7 where:

(a) is the DC response $I_D(V_{GS})$ characteristics of PSC 10/0.25 NMOS and 10/0.25 PMOS devices at 300 K, from 250 nm process.
(b) is the DC response $I_D(V_{DS})$ characteristics of PSC 10/0.25 NMOS and 10/0.25 PMOS devices at 300 K, from 250 nm process.
(c) is the DC response $I_D(V_{GS})$ characteristics of PSC 10/0.25 NMOS and 10/0.25 PMOS devices at 4.2 K, from 250 nm process.
(d) is the DC response $I_D(V_{DS})$ characteristics of PSC 10/0.25 NMOS and 10/0.25 PMOS devices at 4.2 K, from 250 nm process.
(e) is the DC response $I_D(V_{GS})$ characteristics of PSC 10/0.25 NMOS and 10/0.25 PMOS devices at 30 mK, from 250 nm process.
(f) is the DC response $I_D(V_{DS})$ characteristics of PSC 10/0.25 NMOS and 10/0.25 PMOS devices at 30 mK, from 250 nm process.

The DC I(V) measurements were performed using a 4.2 K station for 300 K and 4.2 K measurements, and a dilution refrigerator for 30 mK measurements.

The 4.2 K measurements were performed by cycling the devices through 300 K-4.2 K-300 K to ensure that the devices survived the temperature cycling, however this was not done for the sub-100 mK measurements as the ultra-low temperature effects were deduced to have occurred at a higher temperature than 4.2 K.

The devices produced reproducible and identical 300 K characteristics after temperature cycling, hence the results in FIG. 6(c, d) and FIG. 7(c, d) only contain 300 K results before cooling.

In addition measurements were made from a $n^+$-diffusion resistor of the 500 nm process, using the above setup, with W/L=50/10 the measurement results of which are shown in FIG. 8.

DC response measurements show that the PSC MOSFETs designed and fabricated for higher temperature (218-348 K) operation, can operate at the sub-100 mK region, subject to their particular PSC design and fabrication techniques; more importantly these results show that PSC 500 nm and 250 nm SOS processes are suitable commercial foundry processes for our purposes.

The room temperature characteristics of the 500 nm and 250 nm processes are shown in FIGS. 6 and 7, respectively, with measurements at 300 K, 4.2 K, and 30 mK in (a,b), (c,d), and (e,f), respectively.

Figure 6A:
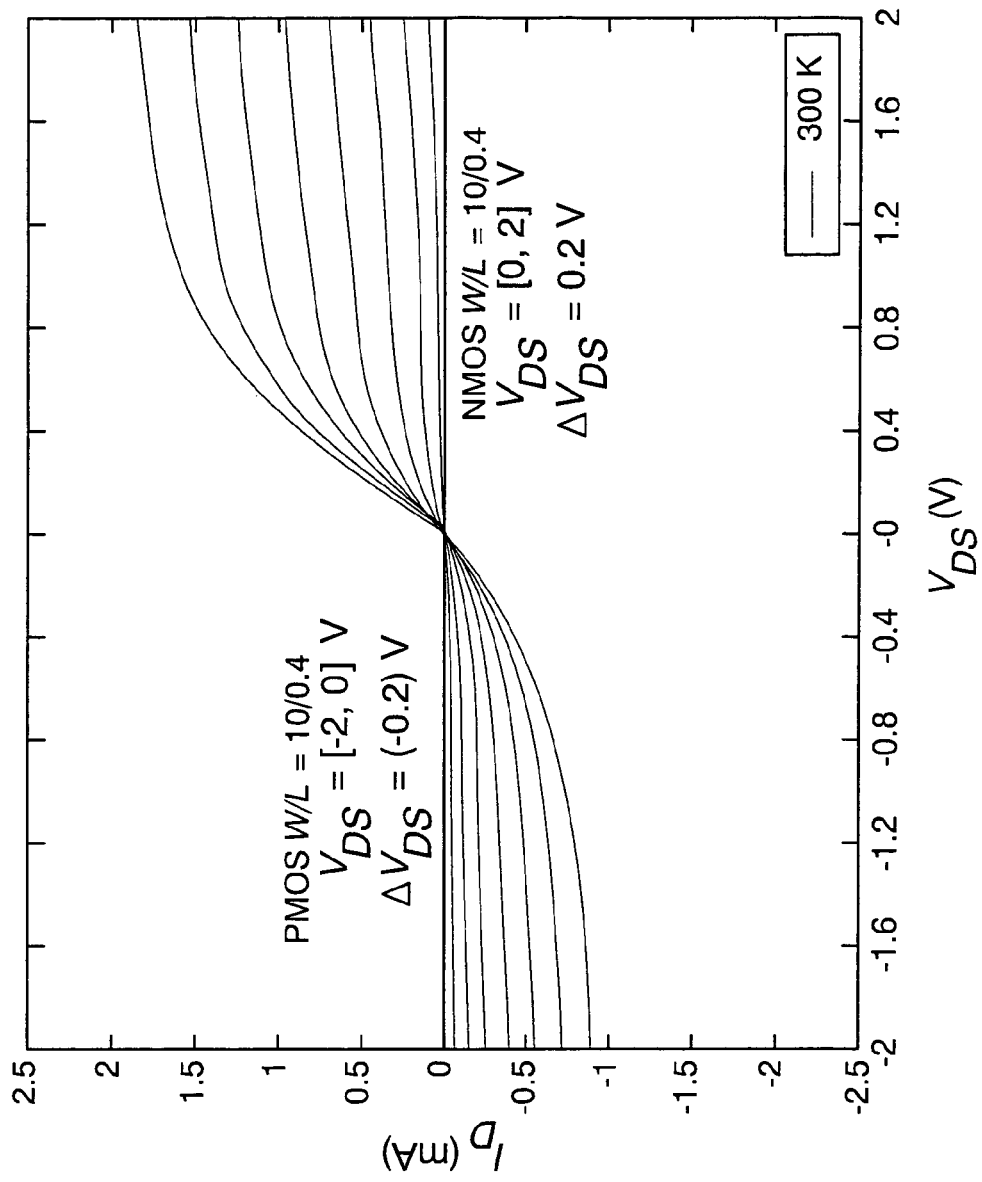
FIG. 6(a) the DC response $I_D(V_{GS})$ characteristic of PSC 10/0.4 NMOS and 10/0.4 PMOS devices at room temperature 300 K, from 500 nm process, FIG. 6(b) the DC response $I_D(V_{DS})$ characteristic of PSC 10/0.4 NMOS and 10/0.4 PMOS devices at room temperature 300 K, from 500 nm process.
Figure 6B:
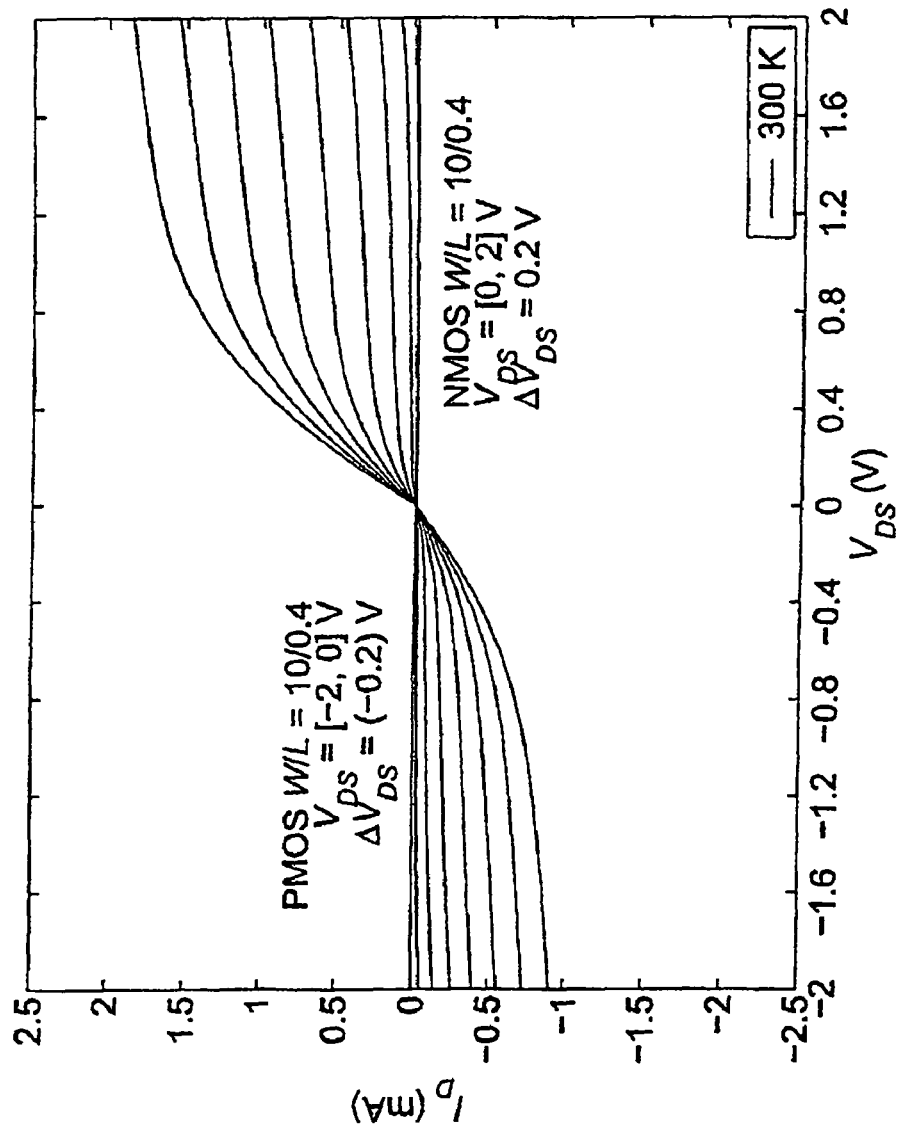
FIG. 6 is a series of graphs as follows.
FIG. 6(c) the DC response $I_D(V_{GS})$ characteristic of PSC 10/0.4 NMOS and 10/0.4 PMOS devices at T=4.2 K, from 500 nm process.
FIG. 6(d) the DC response $I_D(V_{DS})$ characteristic of PSC 10/0.4 NMOS and 10/0.4 PMOS devices at T=4.2 K, from 500 nm process.
FIG. 6(e) the DC response $I_D(V_{GS})$ characteristic of PSC 10/0.4 NMOS and 10/0.4 PMOS devices at T=30 mK, from 500 nm process.
FIG. 6(f) the DC response $I_D(V_{DS})$ characteristic of PSC 10/0.4 NMOS and 10/0.4 PMOS devices at T=30 mK, from 500 nm process.
Figure 6C:
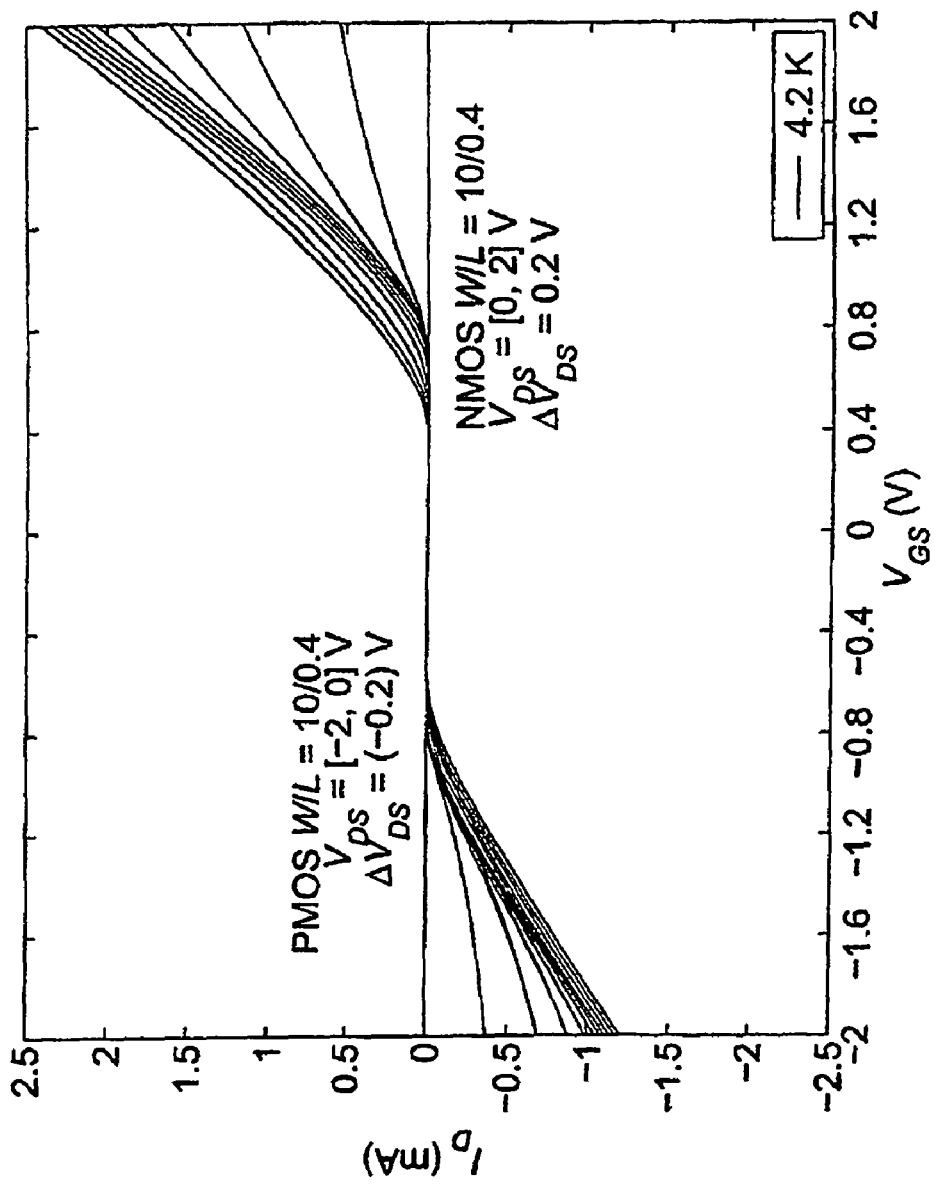
Figure 6D:
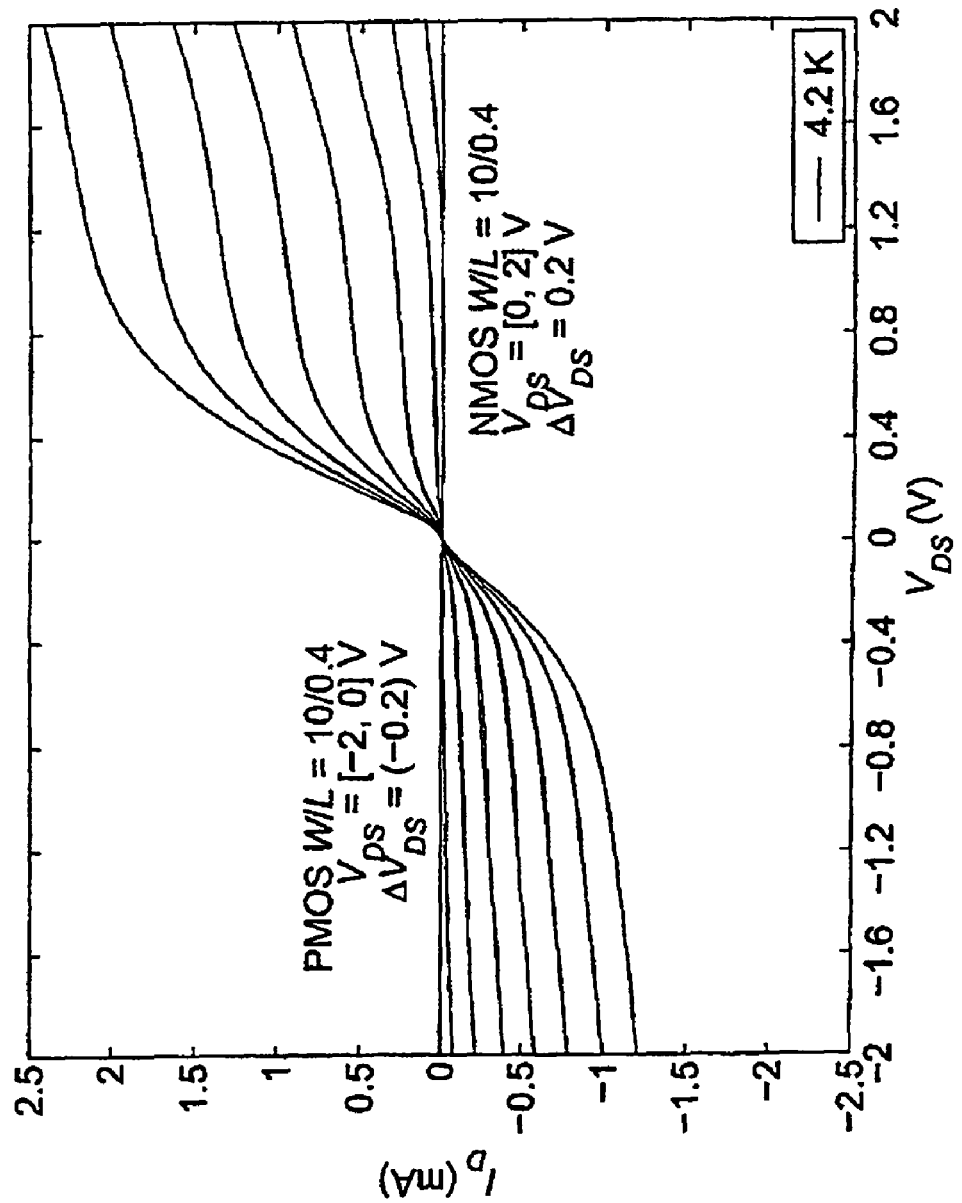
Figure 6E:
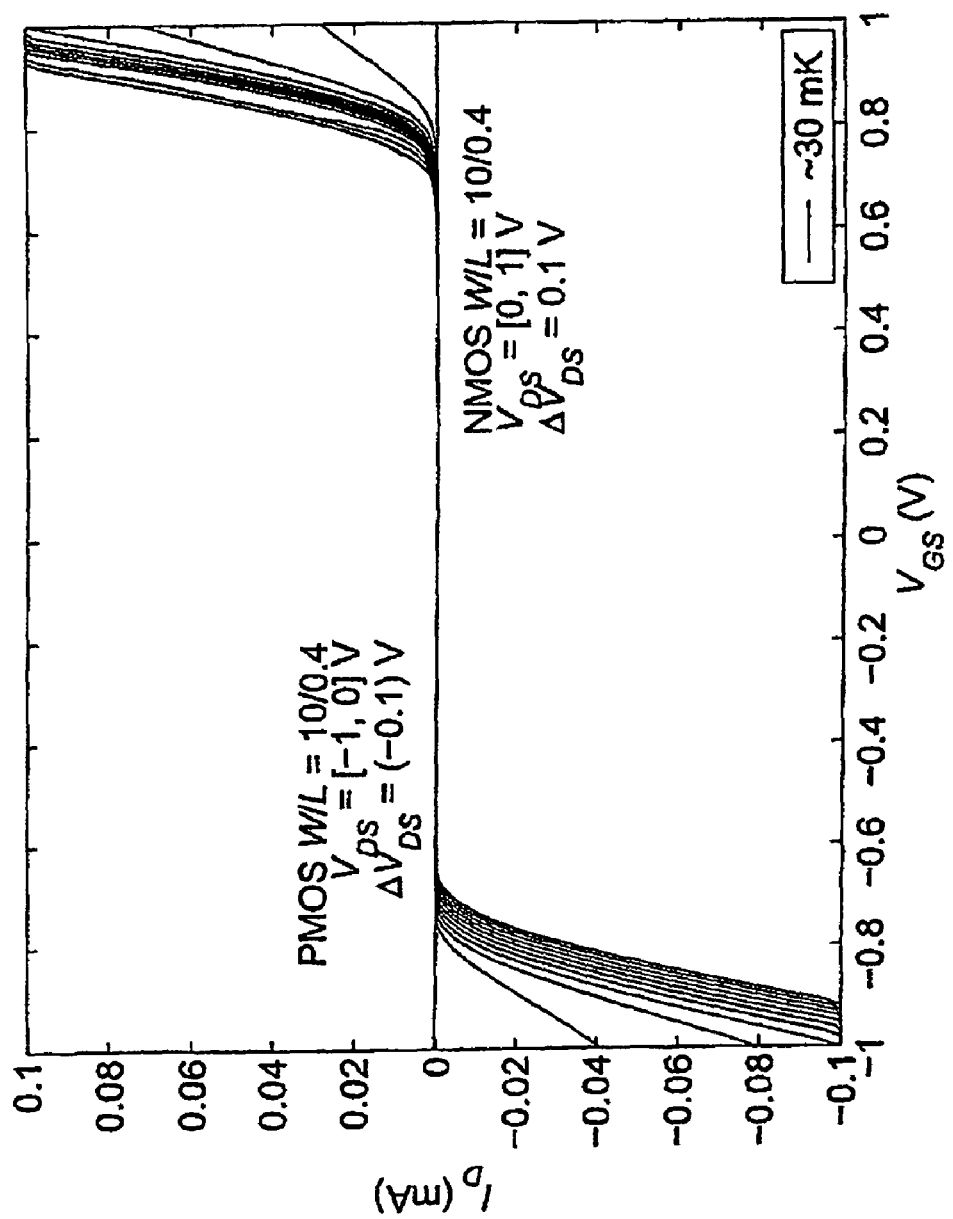
Figure 6F:
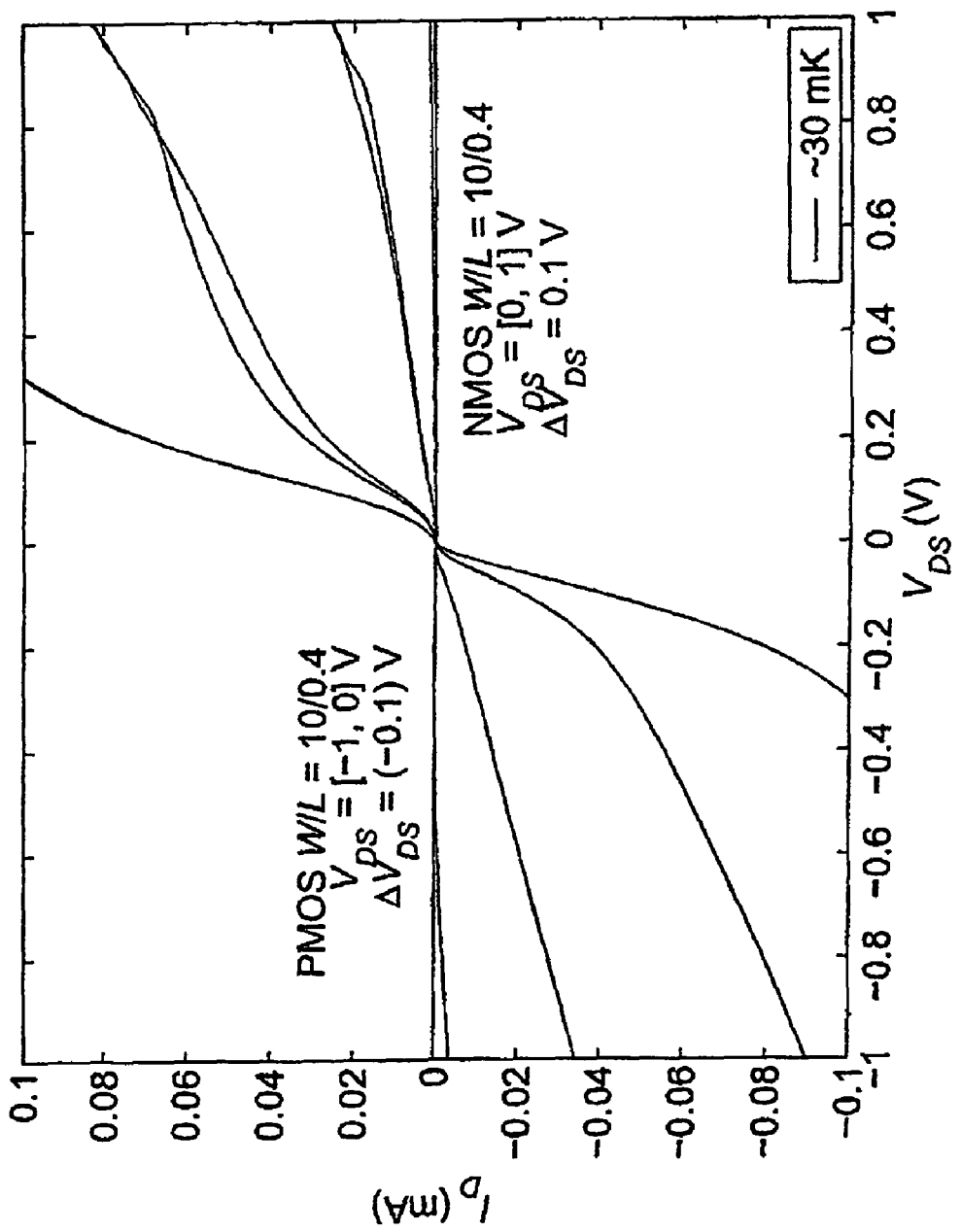
Figure 7A:
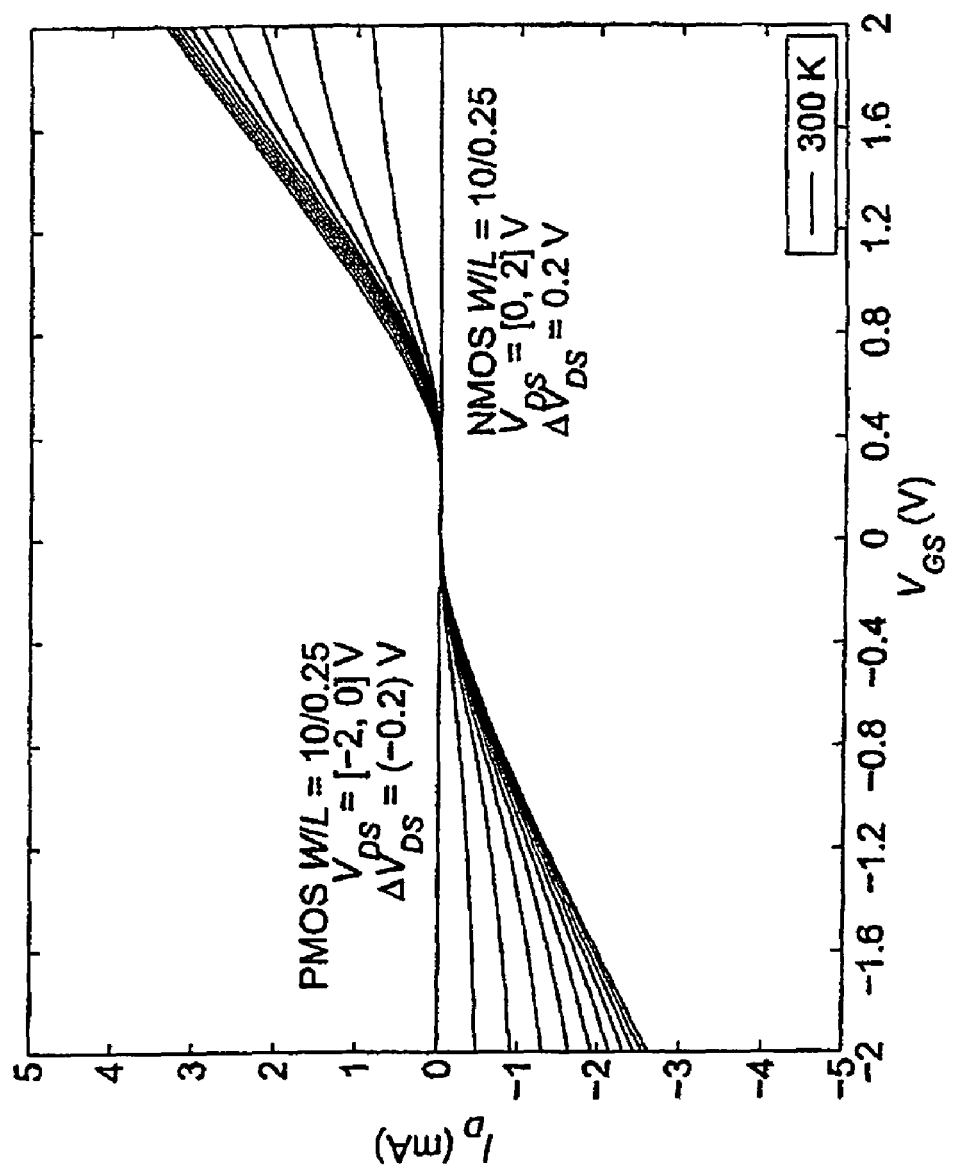
FIG. 7(a) the DC response $I_D(V_{GS})$ characteristics of PSC 10/0.25 NMOS and 10/0.25 PMOS devices at 300 K, from 250 nm process.
Figure 7B:
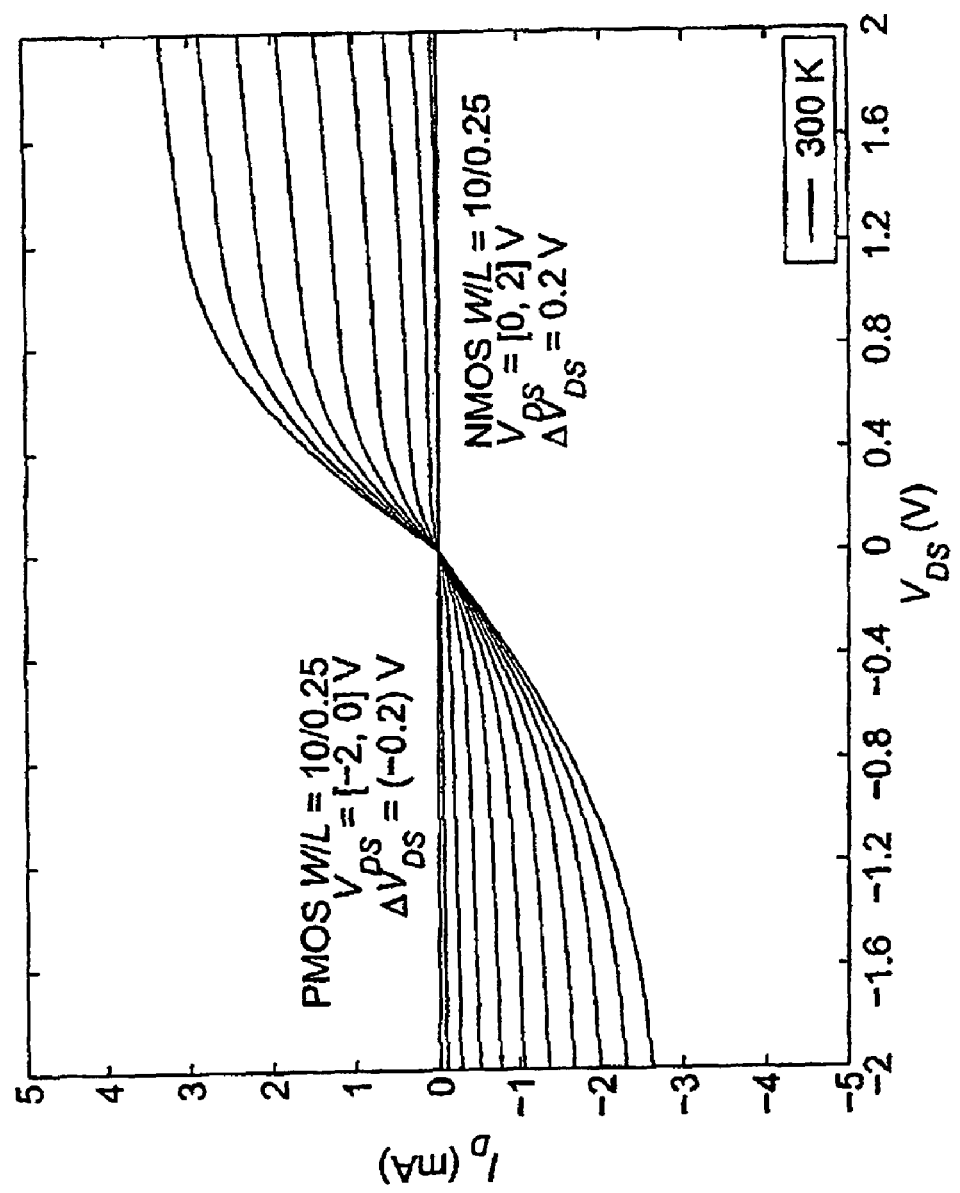
FIG. 7(b) the DC response $I_D(V_{DS})$ characteristics of PSC 10/0.25 NMOS and 10/0.25 PMOS devices at 300 K, from 250 nm process.
Figure 7C:
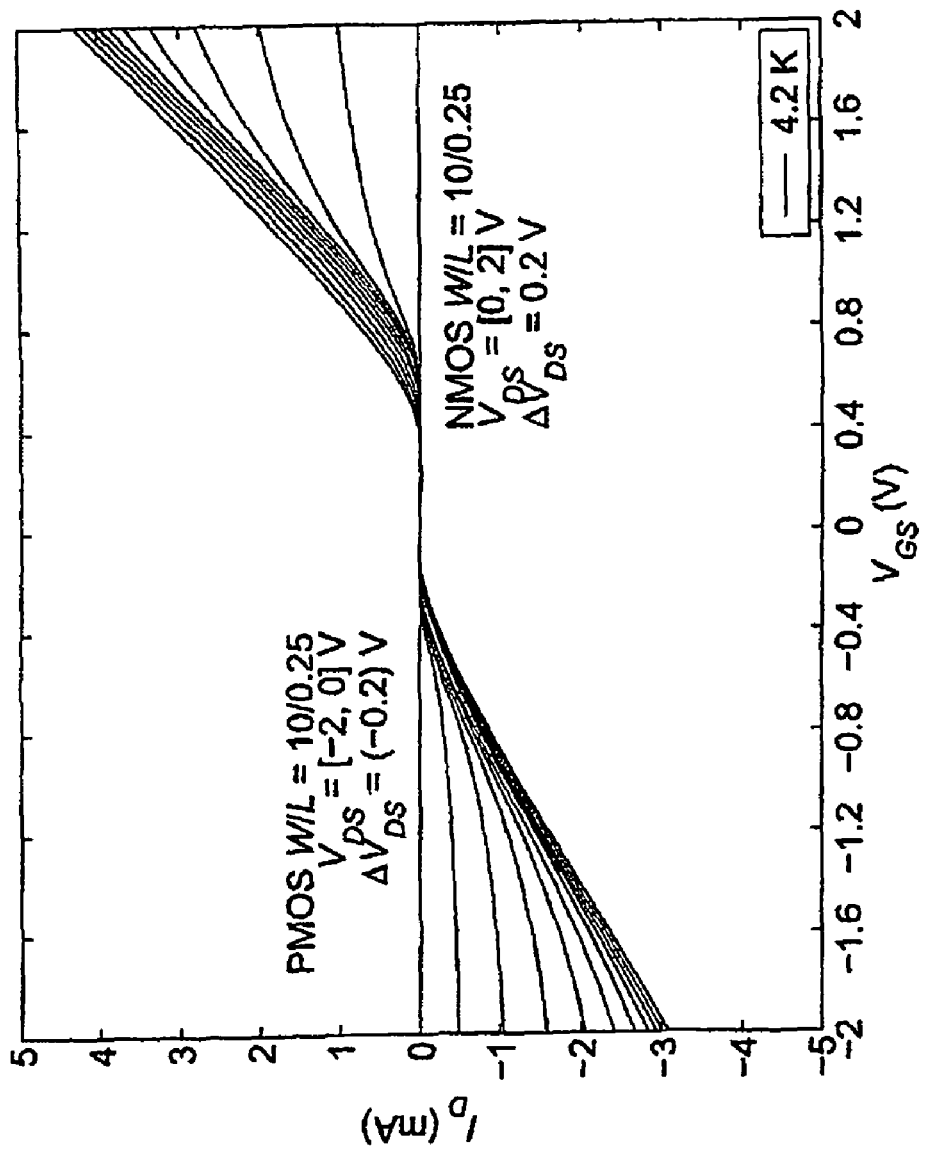
FIG. 7(c) the DC response $I_D(V_{GS})$ characteristics of PSC 10/0.25 NMOS and 10/0.25 PMOS devices at 4.2 K, from 250 nm process.
Figure 7D:
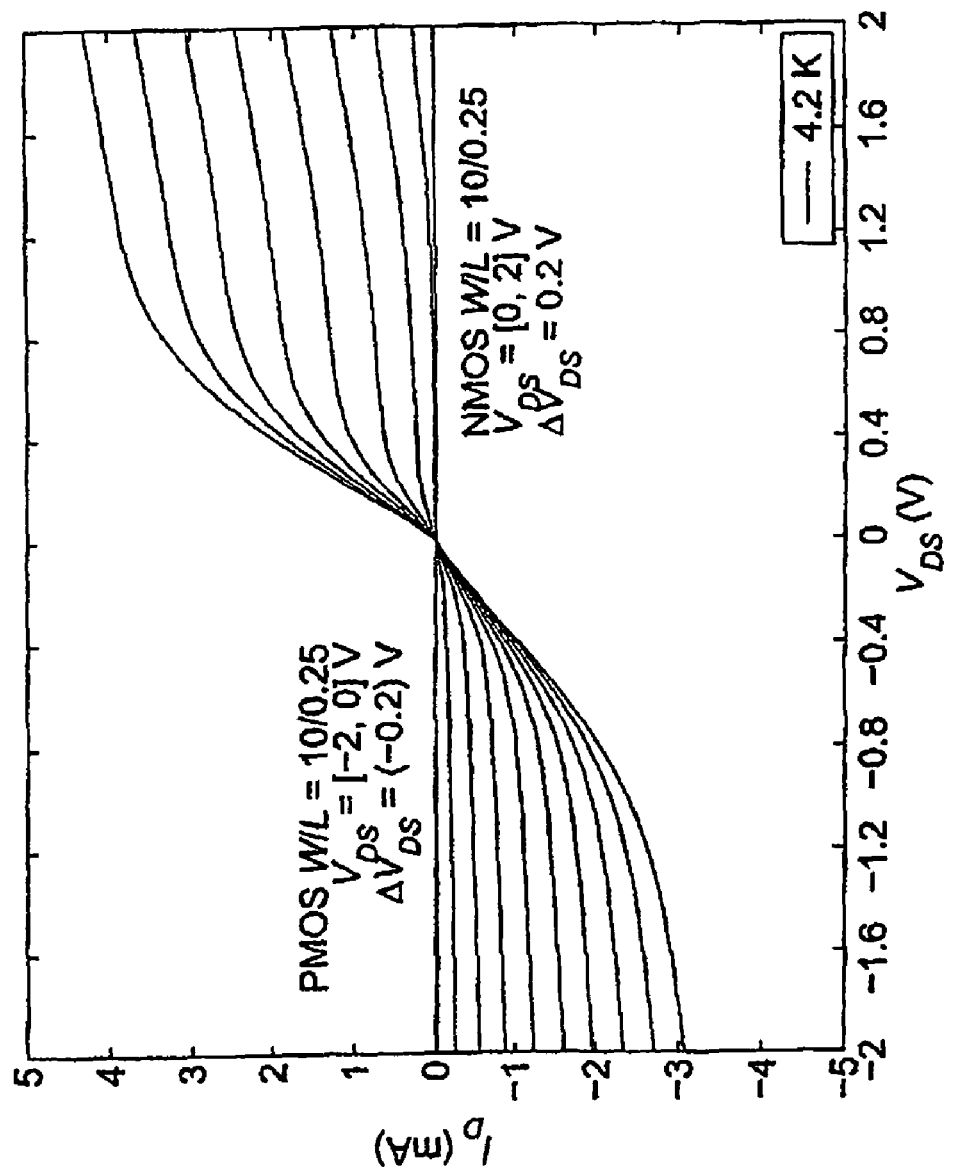
FIG. 7(d) the DC response $I_D(V_{DS})$ characteristics of PSC 10/0.25 NMOS and 10/0.25 PMOS devices at 4.2 K, from 250 nm process.
Figure 7E:
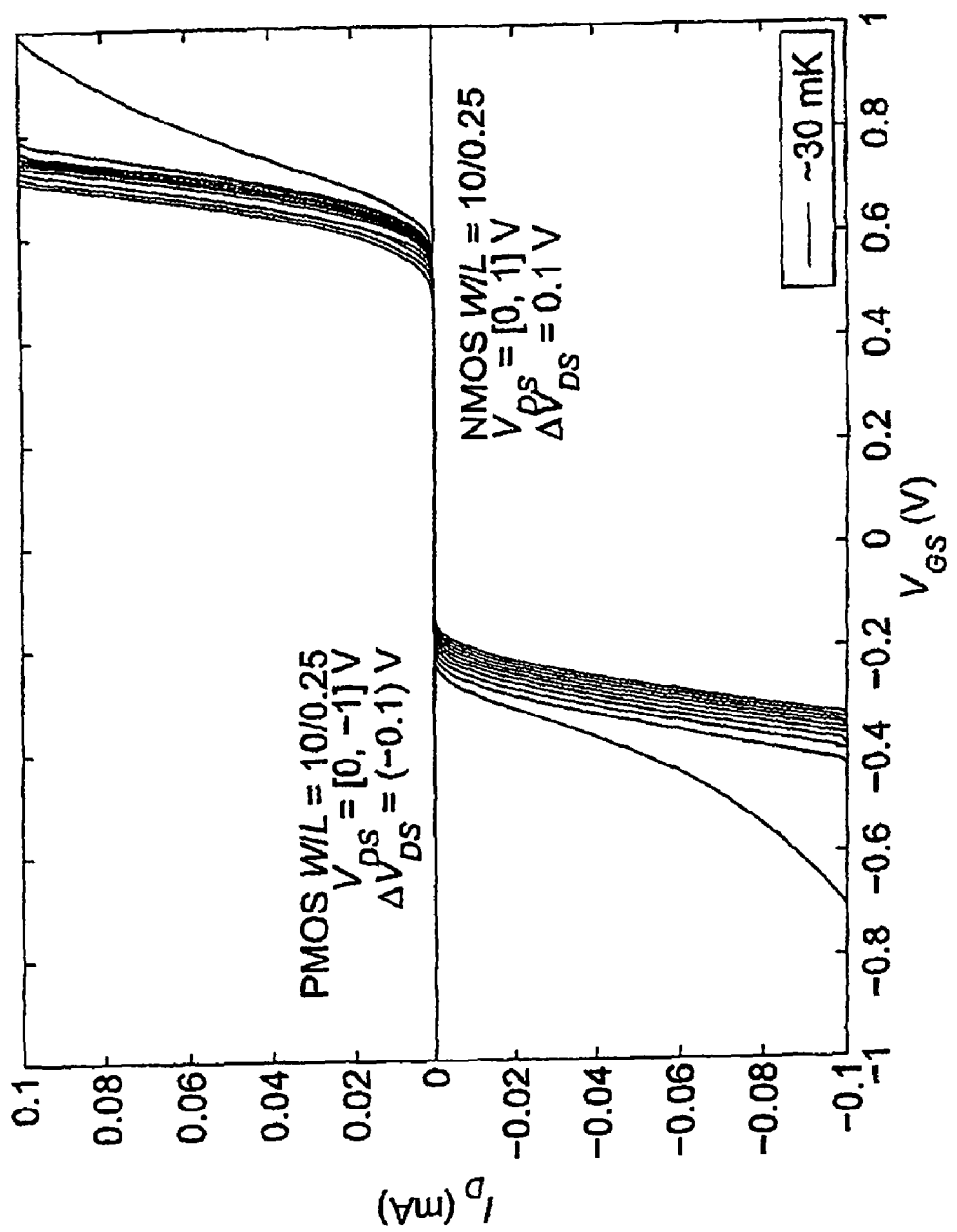
FIG. 7(e) the DC response $I_D(V_{GS})$ characteristics of PSC 10/0.25 NMOS and 10/0.25 PMOS devices at 30 mK, from 250 nm process.
Figure 7F:
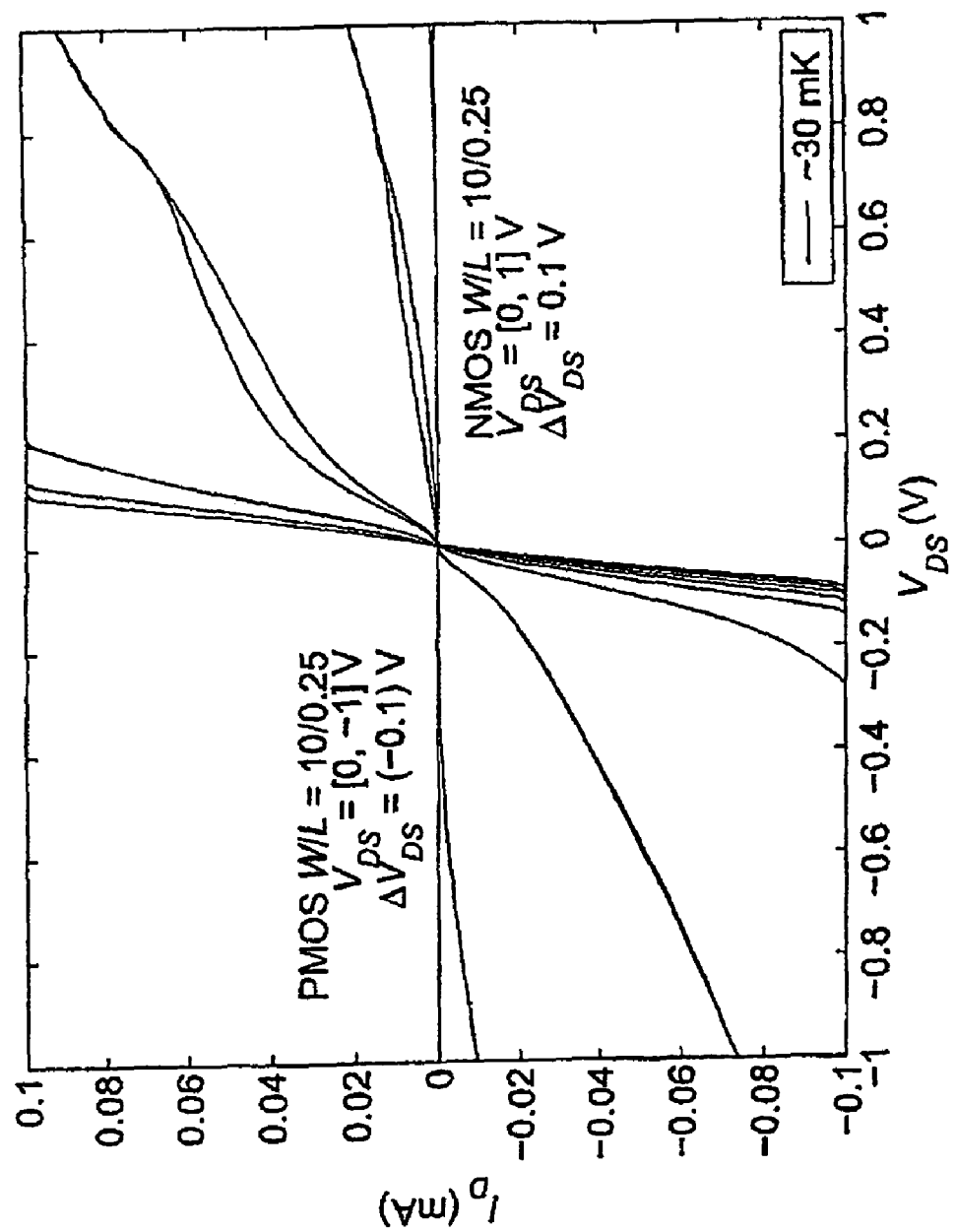
FIG. 7(f) the DC response $I_D(V_{DS})$ characteristics of PSC 10/0.25 NMOS and 10/0.25 PMOS devices at 30 mK, from 250 nm process.

The devices show favorable DC responses for FET-based control circuit design, apart from V, increases in $I_D(V_{GS})$, short-channel effects (SCEs) appearing earlier in their $I_D(V_{DS})$ curves as shown in FIGS. 6(b, d, f) and FIGS. 7(b, d, f), and some degree of non-linearity in the ohmic region of the drain current $I_D$ resulting at low $V_{DS}$ (FIG. 6d and FIG. 7d), compared to that at 300 K (FIGS. 6b, and 7b). There also appears to be a threshold voltage shift at these temperatures (FIG. 6a and FIG. 7a) when compared to that at 300 K (FIG. 6a and FIG. 7a).

$I_D(V_{GS})$ Characteristics:

The increased threshold voltage ($V_t$) at 4.2 K and <100 mK temperatures may be due to carrier freeze-out in the channel region of the NMOS and PMOS devices, thus requiring a higher gate drive voltage to produce carriers in the channel material.

$V_t(V_{DS})$ modulation: The modulation of $V_t$ with increasing $V_{DS}$ may be due to the LDDs (drain extensions) freezing-out thus requiring a higher transverse electric field produced by $V_{DS}$ to produce proportionally higher carrier injection into the channel.

Transconductance ($g_m$) increase: The increased DC currents and transconductance in both NMOS and PMOS devices at 30 mK, and 4.2 K relative to 300 K are most likely be due to lower thermal scattering thus higher mobility along the current paths (channel and ohmic contacts) in the devices.

$I_D(V_{DS})$ Characteristics:

Non-linearity in triode (ohmic) region for low $V_{DS}$: This could be due to the ohmic contacts freezing-out producing higher contact tunnel barriers for carriers to propagate through thus producing some non-linearity. This effect may have been observed previously, at 300 K, in silicon short-channel MOSFETs with metal-silicide drain contacts at 300 K [14], and the proposed explanation is the presence of surface carriers at the source contact region of the channel that screen the effective gate-induced electric field thus reducing carrier injection into the channel from the source [14]. Perhaps in our devices at cryogenic temperatures, these surface states freeze-out producing a similar effect at low $V_{DS}$, but are relieved at higher $V_{DS}$. These surface states could raise the barrier at the ohmic contacts at ultra-low temperatures thus forming a Schottky contact. This could be the reason for the non-linear [15] ohmic region characteristic on the $I_D(V_{DS})$ behavior.

This ohmic region non-linearity is less pronounced in the 250 nm devices than in the 500 nm devices at 4.2 K and at 30 mK. The devices, of course, do not exhibit such behavior at 300 K as they are designed for that temperature region.

SCEs: In these devices, SCEs occur at relatively lower $V_{GS}$ bias at 30 mK and 4.2 K than at 300 K. So these effects are not clearly visible for $V_{GS}$>1.6 V in our data in FIG. 6d and FIG. 7d.

The SCEs, in our devices, are most likely due to the higher electric field required to inject carriers into the channel at cryogenic temperatures thus causing the depletion regions of the contacts to approach each other.

Transient Response Measurements

The experimental setup used to obtain the transient response characterization of PMOS devices at room temperature (300 K), liquid helium temperature (4.2 K), and sub-100 mK temperature (30 mK) is shown in FIG. 5.

The experimental setup 50 involves a high bandwidth DSO 52 including a voltmeter 54 for readout, and a voltage source 56. A pulse generator 58 was used to drive the gate 60 of the PMOS test chip 62.

This approach allowed estimation of the $f_t$ of the devices without having to use a y-parameter frequency analyzer, as it is not possible to immerse such equipment or their probes into a helium (He) Dewar or dilution refrigerator. The relation $t_r \sim f_t^{-1}$, where $t_r$ is the rise time, is used to estimate the $f_t$ of the devices from the transient response measurements.

This setup also allows us to investigate changes in the pulse shape, if any, due to the ultra-low-temperature-effects (non-linearities), revealed in the DC characterization (shown in FIG. 6).

As mentioned above, a controller circuit has to produce fast pulses. Thus transient response of NMOS and PMOS devices provides information about the behavior of the devices at cryogenic temperatures, during ultra-high speed switching.

Due to the maximum effective power dissipation limit of the dilution refrigerator (100 μW), the I(V) data for 30 mK of both 500 nm and 250 nm processes were limited to the range $V_{GS}=V_{DS}=[-1, 1]$ V and $I_D=[-0.1, 0.1]$ mA.

The PMOS measurements revealed a $f_t \sim (100 \text{ ps})^{-1} = 10$ GHz, which was proximal to the quoted value, from PSC, of 20 GHz. The transient response characteristics which were obtain for square-wave functions (emulating step inputs) also showed that the step response of the device is not affected by the non-linearity in the ohmic region and early SCEs in the saturation region of the MOSFETs either at 300 K or at 4.2 K. However we are not certain about both the design of the device and its particular effects on the transient response behavior of the device, we have observed. Hence we emphasize that while our interpretation of the observed results is speculative, the purpose of the transient response measurements at 300 K, and 4.2 K were to ascertain whether the devices would be affected by the deviation of the device characteristics at 4.2 K from those at 300 K.

The underdamped (ringing) behavior at the transition edges was due to a combination of parasitic inductance in the bonding wire and reflections in the lines. The bonding wire inductance was estimated to be about 5 nH for 5 mm of bonding wire which can produce the ringing in transient response as shown in FIG. 9, where:

(a) is the step response characteristics of PSC 10/0.4 PMOS device at 300 K from 500 nm process.

(b) is the step response characteristics of PSC 10/0.4 PMOS device at 4.2 K from 500 nm process.

(c) is the step response characteristics (a) with a different time scale.

(d) is the step response characteristics (b) with a different time scale.

We found that the on-state and off-state responses of the PMOS were similar with almost identical ringing and reflections occurring except during switching. So we have shown the difference (subtraction) between the on- and off-states performed to extract what we believe is the device characteristics.

Our characterization of PSC 500 nm and 250 nm SOS CMOS FETs has confirmed the suitability of the technology for designing the quantum controller and observe circuits.

We have investigated NMOS and PMOS devices from both processes and characterized them for DC response at 300 K, 4.2 K, and 30 mK, and transient response at 300 K, and 4.2 K. We have shown that the devices operate favorable at these ultra-low temperatures with some changes to their characteristics such as a non-linearity in the ohmic region of both NMOS and PMOS in both processes, earlier SCEs such as HCE in the saturation region, and increased transconductance leading to slightly higher current gain.

We conclude that the PSC 500 nm and 250 mm UTSi SOS processes are suitable for use for applications that require ultra-low power or ultra-low temperature operation.

BEST MODES OF THE INVENTION

Part 2

Figure 10:
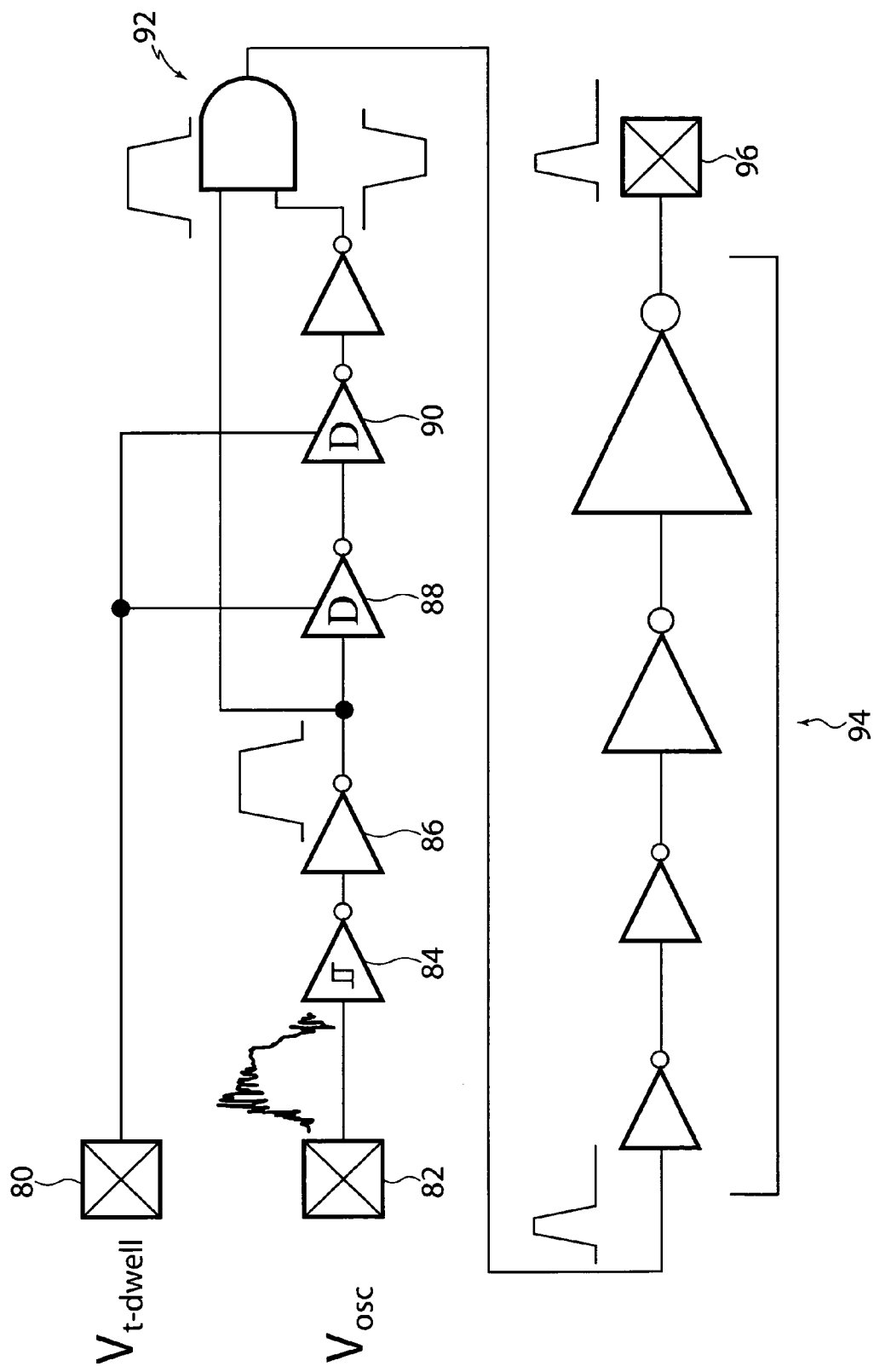
FIG. 10 is a conceptual block-diagram for a fast voltage-pulse generator, suitable for low temperature operation, that has been fabricated using SOI-CMOS.

Further examples of the invention will now be described with reference to the following drawings, in which:

FIG. 10 is a conceptual block-diagram for a fast voltage-pulse generator, suitable for low temperature operation, that has been fabricated using SOI-CMOS.

Figure 11:
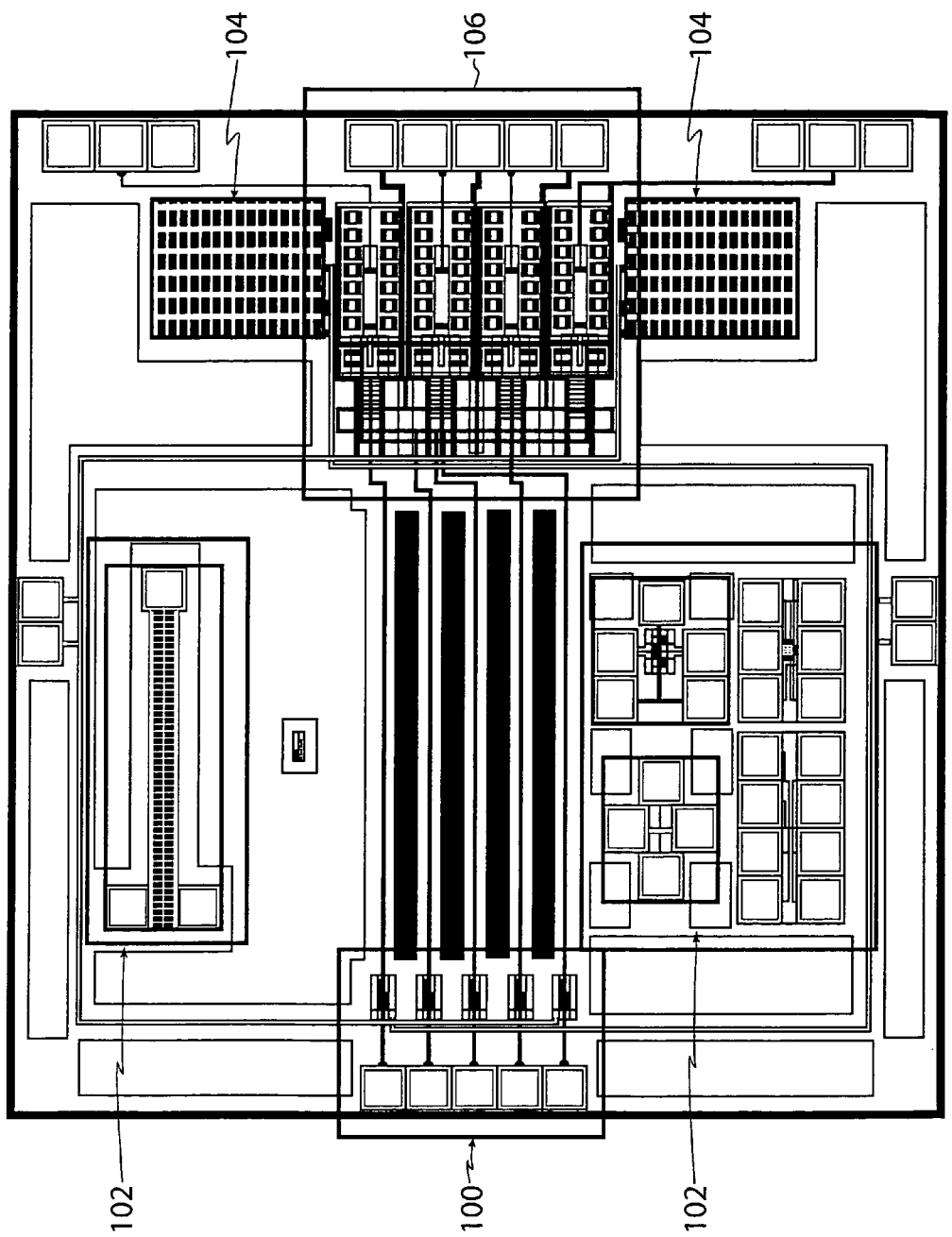
FIG. 11 is a layout diagram for a first generation fast voltage-pulse generator designed in industry-standard Cadence® integrated-circuit (IC) computer-aided design (CAD) software.

FIG. 11 is a layout diagram for a first generation fast voltage-pulse generator designed in industry-standard Cadence® integrated-circuit (IC) computer-aided design (CAD) software.

Figure 12A:
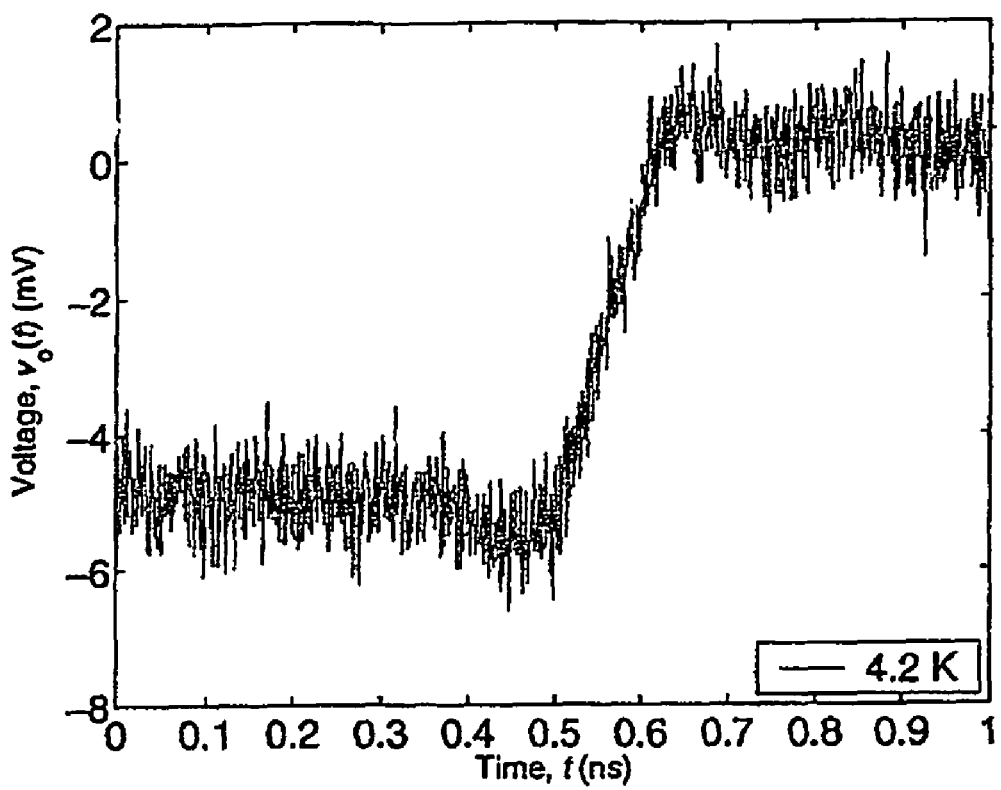
FIGS. 12a and b are graphs showing the power dissipation as a function of pulse-repetition frequency for the fast voltage-pulse generator of FIGS. 10 and 11, measured at low temperature (4.2 K)

FIGS. 12a and b are graphs showing the power dissipation as a function of pulse-repetition frequency for the fast voltage-pulse generator of FIGS. 10 and 11, measured at low temperature (4.2 K).

FIGS. 13a and b are schematic diagrams for the first generation fast voltage-pulse generator for which FIG. 11 is the layout.

Figure 14:
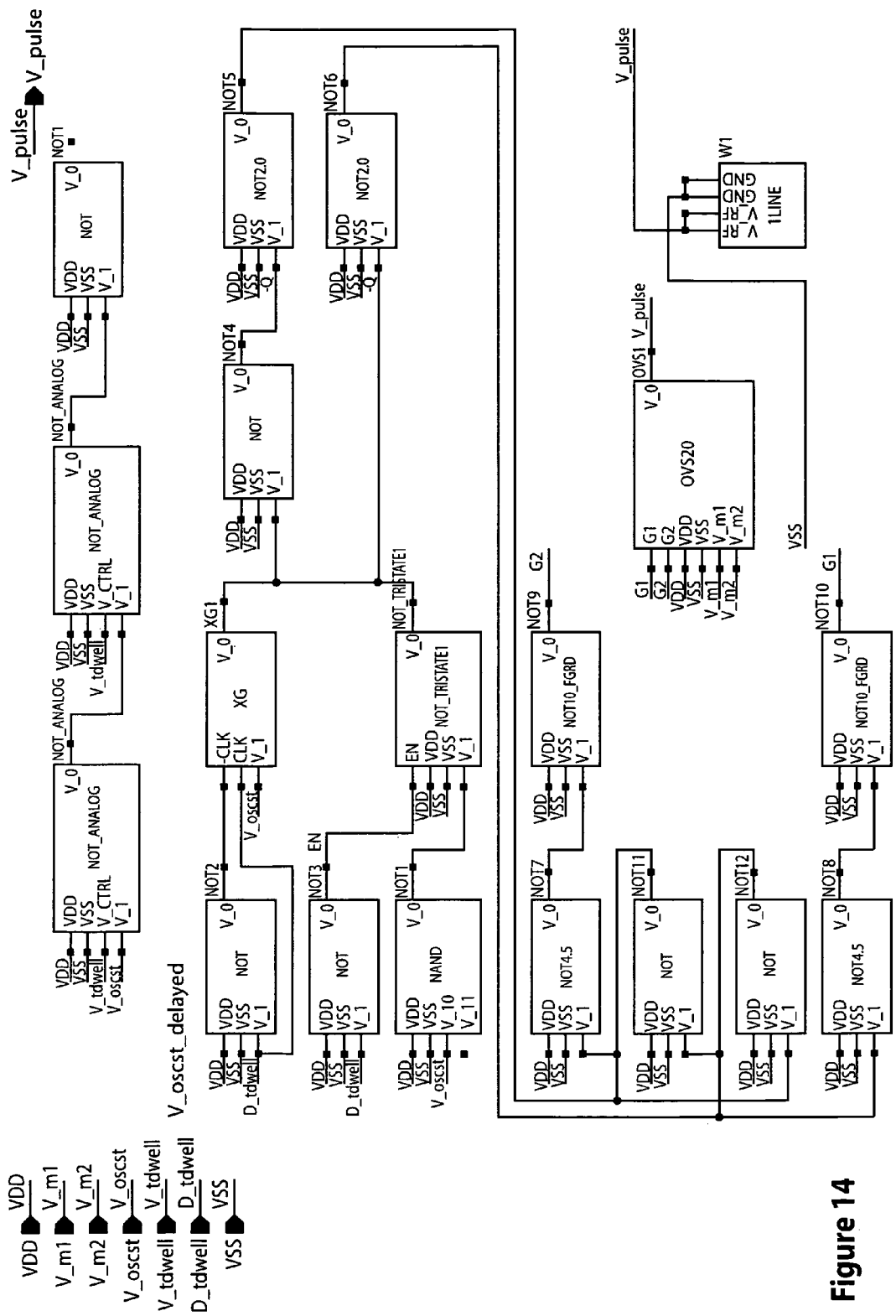
FIG. 14 is a Cadence® screen-capture of the schematic diagram of the voltage-pulse generator design for the generator of FIG. 13.

FIG. 14 is a Cadence® screen-capture of the schematic diagram of the voltage-pulse generator design for the generator of FIG. 13.

Figure 15:
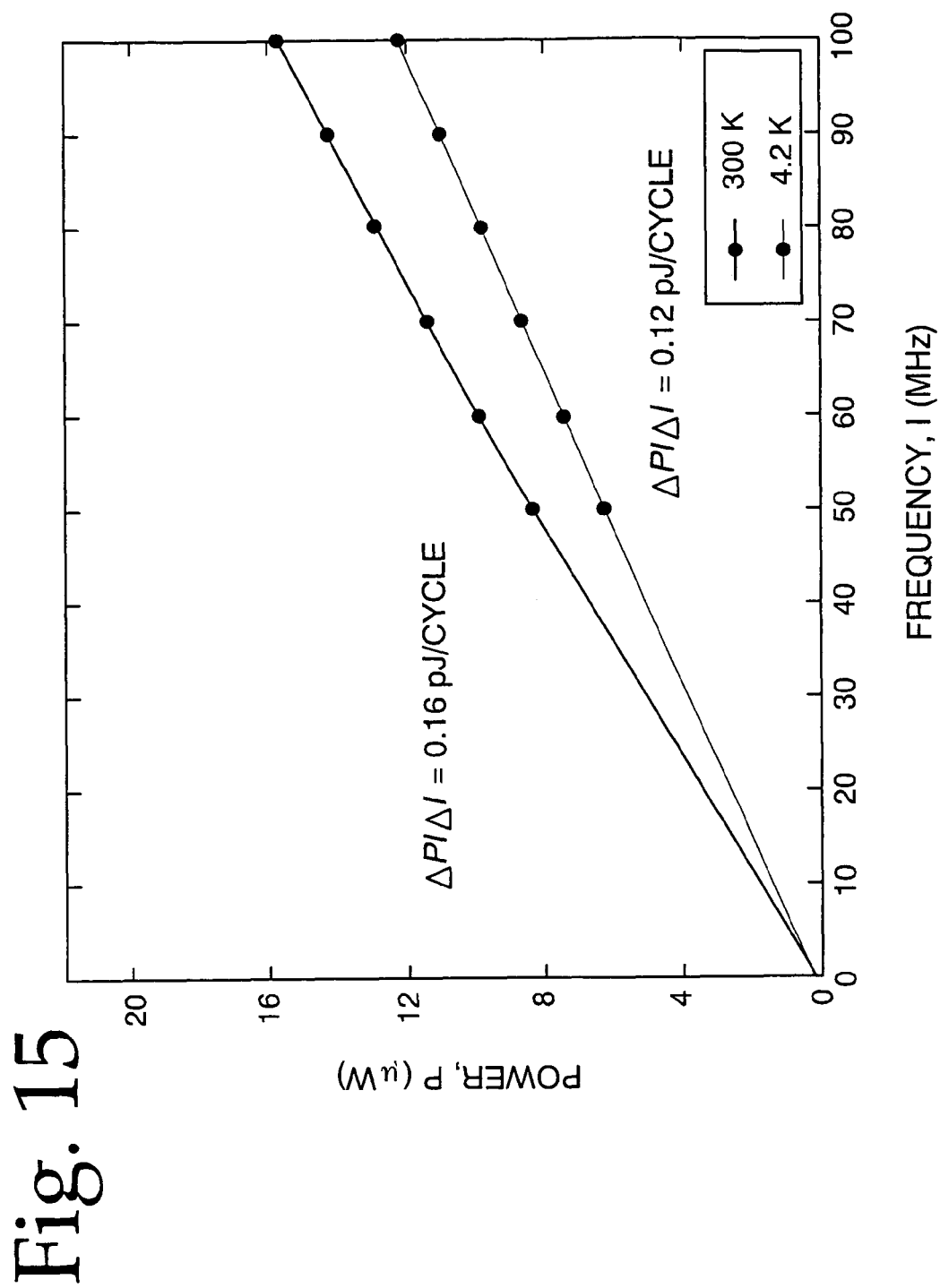
FIG. 15 is a graph showing the power dissipation as a function of pulse-repetition frequency for the fast voltage-pulse generator of FIG. 13, that has been fabricated using SOI-CMOS, measured at both room temperature (300 K) and low temperature (4.2 K).

FIG. 15 is a graph showing the power dissipation as a function of pulse-repetition frequency for the fast voltage-pulse generator of FIG. 13, that has been fabricated using SOI-CMOS, measured at both room temperature (300 K) and low temperature (4.2 K).

Referring now to FIG. 10, which is a conceptual block-diagram for a fast generation fast voltage-pulse generator, suitable for low temperature operation, that has been fabricated using SOI-CMOS. Input pads 80 and 82 are provided for are provided for the $V_{t\text{-}dwell}$ and $V_{osc}$ inputs respectively. Downstream from $V_{osc}$ is a Schmitt trigger 84 and inverter (NOT gate) 86, followed by two delay circuits comprising current-controlled inverters controlled by the signal from $V_{t\text{-}dwell}$. A Nand gate network 92 then presents the signal to a series of buffers 94 to po produce an output signal $V_o$ at pad 96 suitable for driving a large load.

FIG. 11 is a layout diagram for the fast voltage-pulse generator, designed in industry-standard Cadence® integrated-circuit (IC) computer-aided design (CAD) software, for fabrication in SOI-CMOS, suitable for low temperature operation, that has been fabricated using SOI-CMOS. Various structures, including the trigger and control inputs 100, test structures 102, decoupling capacitors 104 and the pulse generator circuit 106 can be seen in this diagram.

Figure 12B:
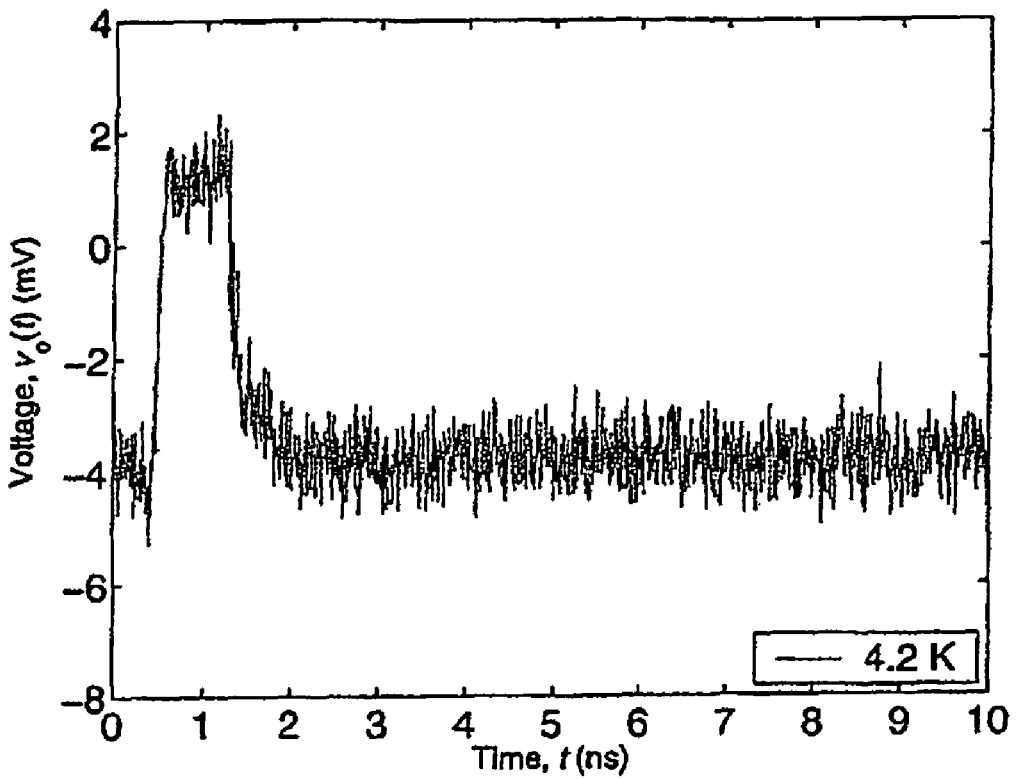

FIG. 12 is a graph showing the power dissipation as a function of pulse-repetition frequency for the fast voltage-pulse generator of FIGS. 10 and 11, measured at low temperature (4.2 K) after tests at 300 K. The mV pulses are due to a voltage division that occurs between the $R_{on,\ nmos}$ of the output voltage switches (OVS) and the input impedance of the high-bandwidth digital storage oscilloscope (DSO) used to capture the measurements. However, the pulses are in fact switching between +0.1 to +0.5 V and −0.1 to −0.5 V respectively. FIG. 12a shows the pulse rise time with experimental evidence of $t_r$~100 ps. FIG. 12b shows the OVS output pulses from the 20/0.5 version, measured at 4.2 K for varying $V_{tdwell}$.

FIG. 13a is the schematic diagram for the layout of FIG. 11. a conceptual block diagram for another fast monostable-pulse generator circuit. The input pads 110 are followed by electrostatic discharge protection circuits (ESD) 112 which are shown in greater detail in FIG. 13b. Then there is the Schmitt trigger 114 and inverter 116, and then the current controlled inverters 118. The Nand gate 120 is followed by a transmission gate 122 and the super-buffer inverters 124. Power supply decoupling inverters 126 are provided for the voltage pulse output switches 128 and 130 which provide the pulses to the output pads 132. These circuits are suitable for low temperature operation, and have been fabricated using SOI-CMOS. FIG. 14 is a Cadence® screen-capture of the schematic diagram of the voltage-pulse generator design. This circuit, operating at sub-100 mK, could be bonded to a quantum electronic containing two-level charge qubit, and is suitable for quantum bit (qubit) control.

FIG. 15 is a graph showing the power dissipation as a function of pulse-repetition frequency for the fast voltage-pulse generator of FIG. 13, that has been fabricated using SOI-CMOS, measured at both room temperature (300 K) and low temperature (4.2 K).

Although the invention has been described with reference to particular MOSFETs with proven low temperature operability, it will be appreciated that many other MOSFET devices may be used in the invention.

Further, although the invention has been described with reference to application to the control of quantum computers, it will be appreciated that it could be applied in other ways. For instance in research requiring time-resolved applications and high-bandwidth signal amplification, such as fundamental semiconductor or pulsed physics, excitons, etc.

It will also be appreciated that an all digital integrated circuit can be fabricated.

REFERENCES

[1] B. E. Kane, "A silicon-based nuclear spin quantum computer," Nature, 393 (6681): 133-137, 1998.
[2] L. C. L. Hollenberg, et al., "Charge-based quantum computing using single donors in semiconductors," Physical Review B, 69 (11): 113301 (4), 2004.
[3] T. A. Ohki, M. Wulf, and M. F. Bocko, "Picosecond on-chip qubit control circuitry," IEEE Transactions on Applied Superconductivity, 15 (2): 837-840, 2005.
[4] K. von Klitzing, G. Dorda, and M. Pepper, "New method for high-accuracy determination of the fine-structure constant based on quantized Hall resistance," Physical Review Letters, 45 (6): 494-497, 1980.
[5] K.-W. Ng, "Operation of an opamp at liquid helium temperature," Physica B, 194-196 (Part 1): 157-158, 1994.
[6] S. H. Wu, and R. L. Anderson, "MOSFET's in the 0° K. approximation: static characteristics of MOSFET's in the 0° K. approximation," Solid-State Electronics, 17 (11): 1125-1137, 1974.
[7] B. Dierickx, L. Warmerdam, E. Simoen, J. Vermeiren, and C. Claeys, "Model for hysteresis and kink behavior of MOS transistors operating at 4.2 K," IEEE Transactions on Electron Devices, 35 (7): 1120-1125, 1988.
[8] K. Uchida, J. Koga, R. Ohba, and A. Toriumi, "Programmable single-electron transistor logic for future low-power intelligent LSI: Proposal and room-temperature operation," IEEE Transactions on Electron Devices, 50 (7): 1623-1630, 2003.
[9] K. Uchida, J. Koga, A. Ohata, and A. Toriumi, "Silicon single-electron tunneling device interfaced with a CMOS inverter," Nanotechnology, 10 (2): 198-200, 1999.
[10] E. Simoen, and C. Claeys, "Impact of CMOS processing steps on the drain current kink of NMOSFETs at liquid helium temperature," IEEE Transactions on Electron Devices, 48 (6): 1207-1215, 2001.
[11] T. van Duzer, Y. Feng, X. Meng, S. R. Whiteley, and N. Yoshikawa, "Hybrid Josephson-CMOS memory: a solution for the Josephson memory problem," Superconductor Science and Technology, 15 (12): 1669-1674, 2002.
[12] Y. Feng, et al., "Josephson-CMOS hybrid memory with ultra-high-speed interface circuit," IEEE Transactions on Applied Superconductivity, 13 (2): 467-470, 2003.
[13] D. S. Crankshaw, et al., "An RSFQ variable duty cycle oscillator for driving a superconductive qubit," IEEE Transactions on Applied Superconductivity, 13 (2): 966-969, 2003.
[14] J. R. Tucker, C. Wang, and P. S. Carney, "Silicon field-effect transistor based on quantum tunneling," Applied Physics Letters, 65 (5): 618-620, 1994.
[15] C. Wang, J. P. Snyder, and J. R. Tucker, "Sub-40 nm PtSi Schottky source/drain metal-oxide-semiconductor field-effect transistors," Applied Physics Letters, 74 (8): 1174-1176, 1999.
[16] L. C. L. Hollenberg et al, "Two-dimensional architectures for donor-based quantum computing", Physical Review, B 74, 045311, 2006.

The invention claimed is:

1. An electronic circuit or system comprising controller or observer circuits, or both, fabricated from ultra-thin silicon-on-insulator (SOI) using CMOS technology and operable at cryogenic temperatures.

2. An electronic circuit according to claim 1, fabricated using SOI-CMOS field-effect transistor (FET) technology.

3. An electronic circuit according to claim 2, including CMOS circuits.

4. An electronic circuit according to claim 1, designed and built using a SOI-CMOS process for radio-frequency (RF) applications.

5. An electronic circuit according to claim 1, wherein a controller circuit is used to generate voltage or current pulses with rapid pulse-edge transition times.

6. An electronic circuit according to claim 1, wherein a controller circuit is used to generate generalized voltage or current waveforms with high temporal control.

7. An electronic circuit according to claim 1, wherein a controller circuit is integrated with and used to control other circuits or systems that require low or ultra-low temperatures for their operation.

8. An electronic circuit according to claim 1, wherein an observer circuit is used as a high-bandwidth, voltage or current amplifier.

9. An integrated circuit comprising tens, hundreds or thousands of electronic circuits according to claim 1.

10. An integrated circuit according to claim 9, further comprising other circuit elements.

11. An integrated circuit according to claim 10, wherein the other circuit elements are circuits or systems being controlled or observed by the controller and observer circuits.

12. An electronic circuit or system operating at low temperatures and ultra-low temperatures and comprising controller or observer circuits, or both, fabricated from ultra-thin silicon-on-insulator (SOI) using CMOS technology, wherein a controller circuit is used to provide a stable steady-state voltage or current waveform suitable to control quantum bits.

13. An electronic circuit according to claim 12, wherein the controller circuit is additionally used to provide duty-cycle (dwell time) controlled rapid single-shot pulses suitable for qubit control.

14. An electronic circuit or system operating at low temperatures and ultra-low temperatures, and comprising controller or observer circuits, or both, fabricated from ultra-thin silicon-on-insulator (SOI) using CMOS technology, and comprising tens, hundreds or thousands of electronic circuits and further comprising other circuit elements, wherein the other circuit elements are circuits or systems being controlled or observed by the controller and observer circuits wherein the other circuit elements are silicon-based quantum bits.

15. A integrated circuit according to claim 14, wherein the other circuit elements involve spin or charge qubits, and the controller and observer circuits are used at low temperatures or ultra-low temperatures for initialization, control and read-out of quantum bits (qubits) in a quantum computer.

* * * * *